(12) United States Patent
Shimizu et al.

(10) Patent No.: US 7,474,350 B2
(45) Date of Patent: Jan. 6, 2009

(54) SOLID STATE IMAGE PICKUP DEVICE COMPRISING LENSES FOR CONDENSING LIGHT ON PHOTODETECTION PARTS

(75) Inventors: Ryu Shimizu, Mizuho (JP); Mitsuru Okigawa, Nagoya (JP); Tetsuya Miwa, Gifu (JP); Hayato Nakashima, Gifu (JP)

(73) Assignee: Sanyo Electric Co., Ltd., Osaka (JP)

( * ) Notice: Subject to any disclaimer, the term of this patent is extended or adjusted under 35 U.S.C. 154(b) by 556 days.

(21) Appl. No.: 10/920,382

(22) Filed: Aug. 18, 2004

(65) Prior Publication Data

US 2005/0052562 A1   Mar. 10, 2005

(30) Foreign Application Priority Data

Sep. 8, 2003 (JP) ............... 2003-314982

(51) Int. Cl.
*H04N 5/225* (2006.01)

(52) U.S. Cl. .................. 348/340; 348/273; 348/294

(58) Field of Classification Search ............ 348/340, 348/273, 294, 308; 257/233; 250/208.1
See application file for complete search history.

(56) References Cited

U.S. PATENT DOCUMENTS

| | | | | |
|---|---|---|---|---|
| 4,667,092 A | * | 5/1987 | Ishihara | ............... 250/216 |
| 5,239,412 A | | 8/1993 | Naka et al. | |
| 5,948,281 A | | 9/1999 | Okazaki et al. | |
| 5,997,756 A | | 12/1999 | Okazaki et al. | |
| 6,008,511 A | * | 12/1999 | Tokumitsu et al. | ......... 257/232 |
| 6,163,407 A | | 12/2000 | Okazaki et al. | |
| 6,274,917 B1 | * | 8/2001 | Fan et al. | ............... 257/432 |
| 6,362,498 B2 | * | 3/2002 | Abramovich | ............ 257/233 |
| 6,518,640 B2 | | 2/2003 | Suzuki et al. | |
| 6,569,703 B1 | | 5/2003 | Fukusho | |
| 6,690,049 B2 | | 2/2004 | Suzuki et al. | |
| 7,019,373 B2 | * | 3/2006 | Hashimoto | ............... 257/432 |
| 7,049,168 B2 | * | 5/2006 | Findlater et al. | ............ 438/69 |
| 7,081,998 B2 | * | 7/2006 | Shimizu et al. | ............ 257/432 |

(Continued)

FOREIGN PATENT DOCUMENTS

JP   04-348565   12/1992

(Continued)

OTHER PUBLICATIONS

Japanese Office Action, with English Translation, issued in Japanese Patent Application No. 2004-245170, dated on Dec. 25, 2007.

(Continued)

*Primary Examiner*—Lin Ye
*Assistant Examiner*—Gevell Selby
(74) *Attorney, Agent, or Firm*—McDermott Will & Emery LLP

(57) ABSTRACT

A solid-state image pickup device improvable in photosensitivity also in the vicinity of an end of a substrate is provided. This solid-state image pickup device comprises a photodetection part formed on a substrate, a color filter layer and a lens, formed between the substrate and the color filter for condensing light on the photodetection part, having a lens center deviated from the center of the photodetection part by a prescribed distance.

10 Claims, 15 Drawing Sheets

U.S. PATENT DOCUMENTS

| | | |
|---|---|---|
| 2001/0026322 A1 | 10/2001 | Takahashi et al. |
| 2005/0035377 A1 | 2/2005 | Kamimura et al. |

FOREIGN PATENT DOCUMENTS

| | | |
|---|---|---|
| JP | 6-104414 | 4/1994 |
| JP | 06-140609 | 5/1994 |
| JP | 09-148554 | 6/1997 |
| JP | 09-266295 | 10/1997 |
| JP | 10-148704 | 6/1998 |
| JP | 10-229180 | 8/1998 |
| JP | 11-040787 | 2/1999 |
| JP | 11-087675 | 3/1999 |
| JP | 2000-164837 | 6/2000 |
| JP | 2000-164839 | 6/2000 |
| JP | 2000-349268 | 12/2000 |
| JP | 2001-160973 | 6/2001 |
| JP | 3430071 | 5/2003 |
| JP | 2003-229550 | 8/2003 |
| KR | 2001-0007214 | 1/2001 |

OTHER PUBLICATIONS

Japanese Office Action for Corresponding Patent Application No. 10-2004-71104.

Chinese Office Action with English translation, issued in corresponding Chinese Patent Application No. 200410074262.9, dated on Apr. 6, 2007.

Chinese Office Action, with English translation, issued in Chinese Patent Application No. CN 200410074262 9 dated on Jul. 7, 2008.

* cited by examiner

SOLID STATE IMAGE PICKUP DEVICE COMPRISING LENSES FOR CONDENSING LIGHT ON PHOTODETECTION PARTS

BACKGROUND OF THE INVENTION

1. Field of the Invention

The present invention relates to a solid-state image pickup device, and more particularly, it relates to a solid-state image pickup device comprising a lens for condensing light on a photodetection part having a photoelectric conversion function.

2. Description of the Background Art

A solid-state image pickup device comprising a lens for condensing light on a photodetection part having a photoelectric conversion function is known in general, as disclosed in Japanese Patent Laying-Open No. 2000-164839, for example.

FIG. 29 is a sectional view showing the structure of a solid-state image pickup device 102 according to first exemplary prior art comprising a lens, having a structure similar to that of the lens disclosed in the aforementioned Japanese Patent Laying-Open No. 2000-164839, for condensing light on a photodetection part. Referring to FIG. 29, the solid-state image pickup device 102 according to the first exemplary prior art comprises a substrate 104. A plurality of photodetection parts 105 having photoelectric conversion functions of converting incident light to charge signals are formed on the surface of the substrate 104 at prescribed intervals. These plurality of photodetection parts 105 form a photodetection region on the surface of the substrate 104. Transfer gates 106 are also provided on the surface of the substrate 104 for transferring the charge signals obtained in the photodetection parts 105 through insulator films 110a. Shielding members 107 are formed to cover the transfer gates 106 through insulator films 110b. The shielding members 107 have functions of preventing the transfer gates 106 from incidence of light. An upwardly convexed lens 109 is formed on the photodetection part 105 located between each adjacent pair of shielding member 107 for condensing light on the photodetection part 105 through the corresponding insulator film 110a. This lens 109 is so arranged that a lens center 109a thereof coincides with the center of the corresponding photodetection part 105. A flattened film 108 having a flat upper surface is formed to cover the transfer gates 106, the shielding members 107 and the lens 109. A color filter layer 111 is formed on the flattened film 108. The lens 109 thus arranged between the color filter layer 111 and the substrate 104 is referred to as an inner lens or the like dissimilarly to a microlens formed on a color filter layer.

FIG. 30 is a sectional view showing a solid-state image pickup device 122 according to second exemplary prior art comprising a lens for condensing light on a photodetection part. Referring to FIG. 30, the solid-state image pickup device 122 according to the second exemplary prior art comprises a downwardly convexed lens 119, dissimilarly to the solid-state image pickup device 102 according to the first exemplary prior art shown in FIG. 29. The downwardly convexed portion of this lens 119 is arranged between a pair of adjacent shielding members 107. A lens center 119a of the lens 119 coincides with the center of a corresponding photodetection part 105 formed on a substrate 104. A color filter layer 121 is formed above the lens 119 through a resin layer 120.

In the solid-state image pickup device 102 according to the first exemplary prior art shown in FIG. 29, however, the lens 109 is so arranged that the lens center 109a coincides with the center of the corresponding photodetection part 105, and hence it is difficult to condense light obliquely incident upon the lens 109 on the center of the photodetection part 105, as shown in FIG. 31. In this conventional solid-state image pickup device 102, optical lenses 101a and 101b set at prescribed intervals from the solid-state image pickup device 102 and an aperture stop 101c arranged between the optical lenses 101a and 101b are employed for introducing external light into the solid-state image pickup device 102 as shown in FIG. 32. At this time, light refracted by the optical lenses 101a and 101b is more obliquely incident upon a pixel 102a located in the vicinity of an end of the solid-state image pickup device 102 as compared with a pixel 102b located in the vicinity of the central portion of the solid-state image pickup device 102. In the solid-state image pickup device 102 according to the first exemplary prior art shown in FIG. 29, as hereinabove described, it is so difficult to condense light obliquely incident upon the lens 109 on the center of the corresponding photodetection part 105 that it is disadvantageously difficult to improve condensation efficiency of the lens 109 for the corresponding photodetection part 105 in the vicinity of an end of the photodetection region receiving the obliquely incident light. Thus, it is problematically difficult to improve the photosensitivity of the solid-state image pickup device 102.

Also in the solid-state image pickup device 122 according to the second exemplary prior art shown in FIG. 30, the lens center 119a of the lens 119 so coincides with the center of the photodetection part 105 that it is disadvantageously difficult to condense light obliquely incident upon the lens 119 on the center of the photodetection part 105, as shown in FIG. 33. Thus, it is problematically difficult to improve the photosensitivity of the solid-state image pickup device 122 in the vicinity of an end of a photodetection region receiving more obliquely incident light as compared with the vicinity of the central portion of the photodetection region, similarly to the solid-state image pickup device 102 according to the first exemplary prior art shown in FIG. 29.

SUMMARY OF THE INVENTION

The present invention has been proposed in order to solve the aforementioned problems, and an object of the present invention is to provide a solid-state image pickup device capable of improving photosensitivity also in the vicinity of an end of a photodetection region.

In order to attain the aforementioned object, a solid-state image pickup device according to a first aspect of the present invention comprises a photodetection part formed on a substrate, a color filter layer and a lens, formed between the substrate and the color filter layer for condensing light on the photodetection part, having a lens center deviated from the center of the photodetection part by a prescribed distance.

In the solid-state image pickup device according to the first aspect, as hereinabove described, the lens center of the lens formed between the substrate and the color filter layer for condensing light on the photodetection part is so deviated from the center of the photodetection part by the prescribed distance that light obliquely incident upon the lens can be efficiently condensed on the photodetection part by adjusting the deviation between the lens center and the center of the photodetection part for focusing the light obliquely incident upon the lens on the photodetection part. Thus, condensation efficiency of the lens for the photodetection part can be improved also in the vicinity of an end of a photodetection region receiving more obliquely incident light as compared with the vicinity of the central portion of the photodetection region when forming the photodetection region on the substrate by a plurality of photodetection parts, whereby the solid-state image pickup device having the lens provided between the substrate and the color filter layer can be improved in photosensitivity.

The aforementioned solid-state image pickup device according to the first aspect is preferably provided with a plurality of lenses including portions consisting of a single continuous layer. According to this structure, adjacent pairs of the lenses are inhibited from forming gaps therebetween so that the solid-state image pickup device can be inhibited from failure in condensation of incident light on the photodetection part resulting from gap regions between the adjacent pairs of lenses also when the lens centers of the plurality of lenses are remarkably deviated from the center of the corresponding photodetection part in correspondence to remarkably obliquely inclined incident light, dissimilarly to a case of discontinuously arranging a plurality of lenses at prescribed intervals (gaps). Thus, the condensation efficiency for the photodetection part can be inhibited from reduction also when the lens centers of the plurality of lenses are remarkably deviated from the center of the corresponding photodetection part in order to condense remarkably obliquely inclined incident light on the photodetection part.

The aforementioned solid-state image pickup device according to the first aspect preferably further comprises a shielding member formed on a region, located between a pair of adjacent photodetection parts, between the substrate and the lens, and the lower end of the lens is preferably arranged upward beyond the upper end of the shielding member. According to this structure, the transverse position for arranging the lens is not limited by the shielding member, whereby the lens center of the lens can be easily deviated from the center of the photodetection part by the prescribed distance.

In this case, the solid-state image pickup device preferably further comprises a flattened film having a flat upper surface at least flush with the upper end of the shielding member, and the lens is preferably formed on the upper surface of the flattened film. According to this structure, the lens can be arranged on an arbitrary position of the upper surface of the flattened film, whereby the lens center of the lens can be easily deviated from the center of the photodetection part by the prescribed distance.

In the aforementioned solid-state image pickup device comprising the flattened film, the flattened film is preferably formed to cover the shielding member. According to this structure, the lens center of the lens can be easily deviated from the center of the photodetection part by the prescribed distance in the solid-state image pickup device having the flattened film formed to cover the shielding member, whereby photosensitivity can be improved.

In the aforementioned solid-state image pickup device comprising the flattened film, the flattened film is preferably formed to cover the side surfaces and the lower surface of the shielding member, and the upper end of the shielding member and the upper surface of the flattened film are preferably substantially flush with each other. According to this structure, the height of the upper surface of the flattened film can be reduced as compared with a case of forming the flattened film to cover the overall shielding member, whereby the lens center of the lens can be deviated from the center of the photodetection part by the prescribed distance while inhibiting the vertical dimension of the solid-state image pickup device from increase. Thus, the photosensitivity of the solid-state image pickup device can be improved while inhibiting the vertical dimension of the solid-state image pickup device from increase.

In the aforementioned solid-state image pickup device comprising the flattened film, the lens preferably includes an upwardly convexed upper surface part and a lower surface part consisting of a flat surface coming into contact with the upper surface of the flattened film. According to this structure, the lens can be easily arranged on an arbitrary position of the flat surface of the flattened film while light can be refracted through the upwardly convexed upper surface part of the lens and condensed on the photodetection part.

In this case, the solid-state image pickup device preferably further comprises a resin layer having a flat upper surface formed to cover the upwardly convexed upper surface part of the lens, and the color filter layer is preferably formed on the flat upper surface of the resin layer. According to this structure, the color filter layer can be formed on the flat upper surface with no influence by the convexed upper surface part of the lens, whereby the color filter layer can be easily formed on the upwardly convexed lens.

The aforementioned solid-state image pickup device according to the first aspect preferably further comprises a photodetection region formed on the substrate by a plurality of photodetection parts, while a plurality of lenses are preferably provided to correspond to the respective ones of the plurality of photodetection parts and the deviation between the lens center of the lens located in the vicinity of an end of the photodetection region and the center of the corresponding photodetection part is preferably larger as compared with the deviation between the lens center of the lens located in the vicinity of the central portion of the photodetection region and the center of the corresponding photodetection part. According to this structure, light more obliquely incident in the vicinity of the end of the photodetection region as compared with the vicinity of the central portion of the photodetection region can be efficiently condensed on the photodetection part while substantially perpendicular light can be condensed on the photodetection part in the vicinity of the central portion of the photodetection region. Thus, the condensation efficiency for the photodetection part can be improved both in the vicinities of the central portion and the end of the photodetection region.

The aforementioned solid-state image pickup device according to the first aspect preferably further comprises a photodetection region formed on the substrate by a plurality of photodetection parts, while the deviation between the lens centers of the lenses and the centers of the corresponding photodetection parts is preferably gradually increased from the vicinity of the central portion of the photodetection region toward the end of the photodetection region along the direction of arrangement of the plurality of photodetection parts. According to this structure, light having an angle of incidence gradually increased from the vicinity of the central portion of the photodetection region toward the end of the photodetection region along the direction of arrangement of the plurality of photodetection parts can be effectively condensed on the photodetection parts in response to the angle of incidence. Thus, the condensation efficiency for the photodetection parts can be improved along the overall region of the photodetection region including the vicinities of the central portion and the end thereof.

In this case, the deviation between the lens centers of the lenses and the centers of the corresponding photodetection parts is preferably calculated according to the following formula:

$$a \times h/L$$

assuming that L represents the distance between the photodetection parts and an exit pupil, h represents an arbitrary distance larger than the distance between the vertical position of the upper surfaces of the photodetection parts and the vertical position of the boundary between an adjacent pair of lenses and smaller than the distance between the vertical position of the upper surfaces of the photodetection parts and the vertical position of the lens centers of the lenses and a represents the distance between the center of an arbitrary photodetection part in the photodetection region and the center of the photodetection region. According to this structure, light having an angle of incidence gradually increased from the vicinity of the central portion of the photodetection region toward the end of the photodetection region along the direction of arrangement of the plurality of photodetection parts can be effectively condensed on the photodetection parts through the lenses in response to the angle of incidence.

A solid-state image pickup device according to a second aspect of the present invention comprises a plurality of photodetection parts formed on a substrate, a photodetection region formed on the substrate by a plurality of photodetection parts, a color filter layer, a shielding member formed on a region, above the photodetection region, between an adjacent pair of photodetection parts and a plurality of lenses, formed between the substrate and the color filter layer for condensing light on the photodetection parts, including lower ends arranged upward beyond the upper end of the shielding member and upwardly convexed upper surface parts, and the plurality of lenses include portions consisting of a single continuous layer.

In the solid-state image pickup device according to the second aspect, as hereinabove described, the upper surface parts of the lenses formed between the substrate and the color filter layer for condensing light on the photodetection parts are upwardly convexed while the lenses are so arranged that the lower ends thereof are upward beyond the upper end of the shielding member so that transverse positions for arranging the lenses are not limited by the shielding member, whereby light obliquely incident upon the lenses can be refracted through the upwardly convexed upper surface parts of the lenses and efficiently condensed on the photodetection parts when the lens centers are deviated from the centers of the photodetection parts by prescribed transverse distances for focusing the light obliquely incident upon the lenses on the photodetection parts. Thus, condensation efficiency of the lenses for the photodetection parts can be improved also in the vicinity of an end of the photodetection region receiving more obliquely incident light as compared with the vicinity of the central portion of the photodetection region, whereby the solid-state image pickup device provided with the lenses between the substrate and the color filter layer can be improved in photosensitivity. Further, the plurality of lenses are so constituted to include the portions consisting of the single continuous layer that adjacent pairs of the lenses can be inhibited from forming gaps therebetween, whereby the solid-state image pickup device can be inhibited from failure in condensation of incident light on the photodetection parts resulting from gap regions between the adjacent pairs of lenses also when the lens centers of the plurality of lenses are remarkably deviated from the centers of the photodetection parts in correspondence to remarkably obliquely inclined incident light, dissimilarly to a case of discontinuously arranging a plurality of lenses at prescribed intervals (gaps). Thus, the condensation efficiency for the photodetection parts can be inhibited from reduction also when the lens centers of the plurality of lenses are remarkably deviated from the centers of the photodetection parts in order to condense remarkably obliquely inclined incident light on the photodetection parts.

In the aforementioned solid-state image pickup device according to the second aspect, the lenses preferably have lens centers deviated from the centers of the photodetection parts by prescribed distances. According to this structure, obliquely incident light can be easily refracted through the upwardly convexed upper surface parts of the lenses and effectively condensed on the photodetection parts.

In this case, the solid-state image pickup device preferably further comprises a flattened film having a flat upper surface at least flush with the upper end of the shielding member, and the lenses are preferably formed on the upper surface of the flattened film. According to this structure, the lenses can be arranged on arbitrary positions of the upper surface of the flattened film, whereby the lens centers of the lenses can be easily deviated from the centers of the photodetection parts by the prescribed distances.

In the aforementioned solid-state image pickup device comprising the flattened film, the flattened film is preferably formed to cover the shielding member. According to this structure, the lens centers of the lenses can be easily deviated from the centers of the photodetection parts by the prescribed distances in the solid-state image pickup device having the flattened film formed to cover the shielding member, whereby photosensitivity can be improved.

In the aforementioned solid-state image pickup device comprising the flattened film, the flattened film is preferably formed to cover the side surfaces and the lower surface of the shielding member, and the upper end of the shielding member and the upper surface of the flattened film are preferably substantially flush with each other. According to this structure, the height of the upper surface of the flattened film can be reduced as compared with a case of forming the flattened film to cover the overall shielding member, whereby the lens centers of the lenses can be easily deviated from the centers of the photodetection parts by the prescribed distances while inhibiting the vertical dimension of the solid-state image pickup device from increase. Thus, the photosensitivity of the solid-state image pickup device can be improved while inhibiting the vertical dimension of the solid-state image pickup device from increase.

In the aforementioned solid-state image pickup device comprising the flattened film, the lenses preferably include lower surface parts consisting of flat surfaces coming into contact with the upper surface of the flattened film. According to this structure, the lenses can be easily arranged on arbitrary positions of the flat surface of the flattened film.

The aforementioned solid-state image pickup device according to the second aspect preferably further comprises a resin layer having a flat upper surface formed to cover the upwardly convexed upper surface parts of the lenses, and the color filter layer is preferably formed on the flat upper surface of the resin layer. According to this structure, the color filter layer can be formed on the flat upper surface with no influence by the convexed upper surface parts of the lenses, whereby the color filter layer can be easily formed on the upwardly convexed lenses.

In the aforementioned structure of the lenses having the lens centers deviated from the centers of the photodetection parts by the prescribed distances, the plurality of lenses are preferably provided to correspond to the respective ones of the plurality of photodetection parts, and the deviation between the lens center of the lens located in the vicinity of an end of the photodetection region and the center of the corresponding photodetection part is larger as compared with the deviation between the lens center of the lens located in the vicinity of the central portion of the photodetection region and the center of the corresponding photodetection part.

According to this structure, light more obliquely incident in the vicinity of the end of the photodetection region as compared with the vicinity of the central portion of the photodetection region can be efficiently condensed on the photodetection part while substantially perpendicular light can be condensed on the photodetection part in the vicinity of the central portion of the photodetection region. Thus, the condensation efficiency for the photodetection parts can be improved both in the vicinities of the center and the end of the photodetection region.

In the aforementioned structure of the lenses having the lens centers deviated from the centers of the photodetection parts by the prescribed distances, the deviation between the lens centers of the lenses and the centers of the corresponding photodetection parts is preferably gradually increased from the vicinity of the central portion of the photodetection region toward the end of the photodetection region along the direction of arrangement of the plurality of photodetection parts. According to this structure, light having an angle of incidence gradually increased from the vicinity of the central portion of the photodetection region toward the end of the photodetection region along the direction of arrangement of the plurality of photodetection parts can be effectively condensed on the photodetection parts in response to the angle of incidence. Thus, the condensation efficiency for the photodetection parts can be improved along the overall region of the photodetection region including the vicinities of the central portion and the ends of the photodetection region.

In this case, the deviation between the lens centers of the lenses and the centers of the corresponding photodetection parts is preferably calculated according to the following formula:

$$a \times h/L$$

assuming that L represents the distance between the photodetection parts and an exit pupil, h represents an arbitrary distance larger than the distance between the vertical position of the upper surfaces of the photodetection parts and the vertical position of the boundary between an adjacent pair of lenses and smaller than the distance between the vertical position of the upper surfaces of the photodetection parts and the vertical position of the lens centers of the lenses and a represents the distance between the center of an arbitrary photodetection part in the photodetection region and the center of the photodetection region. According to this structure, light having an angle of incidence gradually increased from the vicinity of the central portion of the photodetection region toward the end of the photodetection region along the direction of arrangement of the plurality of photodetection parts can be effectively condensed on the photodetection parts through the lenses in response to the angle of incidence.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention are now described with reference to the drawings.

First Embodiment

The structure of a solid-state image pickup device 50 according to a first embodiment of the present invention is described with reference to FIGS. 1 to 3.

Figure 1:
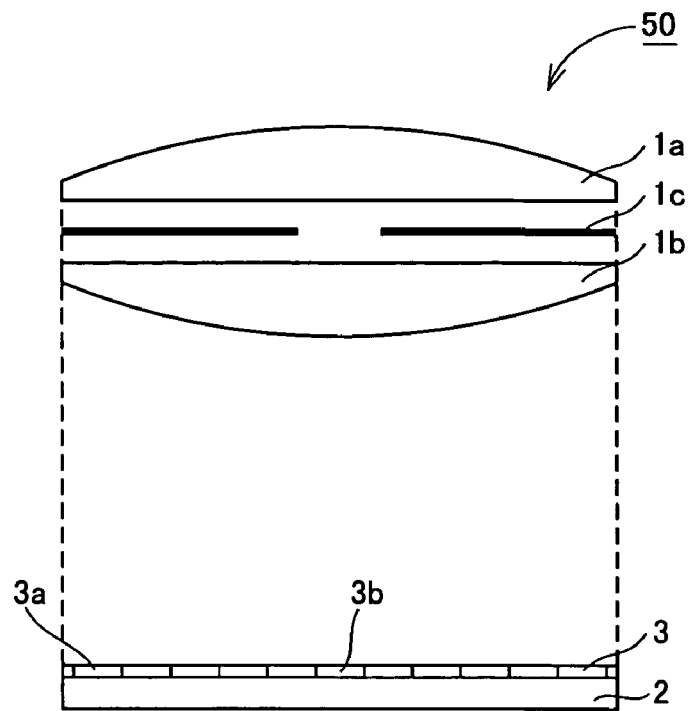
FIG. 1 is a schematic diagram showing the overall structure of a solid-state image pickup device according to a first embodiment of the present invention.

The solid-state image pickup device 50 according to the first embodiment of the present invention comprises two optical lenses 1a and 1b, an aperture stop 1c and a solid-state image sensor 2, as shown in FIG. 1. The solid-state image sensor 2, the two optical lenses 1a and 1b and the aperture stop 1c are arranged at prescribed intervals from each other respectively. The optical lenses 1a and 1b are provided for condensing reflected light from an object. The aperture stop 1c is arranged between the optical lenses 1a and 1b. Thus, light is incident upon the optical lens 1b from the optical lens 1a through an aperture of the aperture stop 1c.

Te solid-state image sensor 2 has the structure of an interline CCD (charge-coupled device). More specifically, the solid-state image sensor 2 includes a plurality of pixels 3. In the pixels 3 of the solid-state image sensor 2, a plurality of photodetection parts 5 having photoelectric conversion functions of converting incident light to charge signals are formed on prescribed regions of the surface of a semiconductor substrate 4, as shown in FIG. 2. The plurality of photodetection parts 5 are arranged to correspond to the respective pixels 3 at prescribed intervals of about 2 μm to about 5 μm respectively. The plurality of photodetection parts 5 form a photodetection region 5a on the surface of the semiconductor substrate 4, as shown in FIG. 3. Transfer gates 6 for transferring the charge signals obtained in the photodetection parts 5 are provided on the surface of the semiconductor substrate 4 through insulator films 15, as shown in FIG. 2. The transfer gates 6 are made of polysilicon. Shielding members 7 of a metal such as Al are formed to cover upper portions of the transfer gates 6 through insulator films 16. These shielding members 7 are provided on regions between adjacent pairs of photodetection parts 5 above the photodetection region 5a (see FIG. 3). The shielding members 7 have functions of preventing the transfer gates 6 from incidence of light.

According to the first embodiment, a flattened film 8 consisting of a silicon oxide film having a flat upper surface 8a is formed to cover the shielding members 7 and the transfer gates 6. The upper surface 8a of the flattened film 8 is formed on a vertical position of about 100 nm to about 800 nm from the upper ends of the shielding members 7. A plurality of lenses 9 of SiN having upwardly convexed upper surface parts and flat lower surface parts coming into contact with the upper surface 8a of the flattened film 8 are formed on the upper surface 8a of the flattened film 8. These lenses 9 have functions of condensing light on the photodetection parts 5. The lenses 9 are about 500 nm to about 800 nm in width at lens centers 9a, and about 50 nm to about 200 nm in thickness on boundaries 9b between adjacent pairs of the upwardly convexed upper surfaces.

Figure 2:
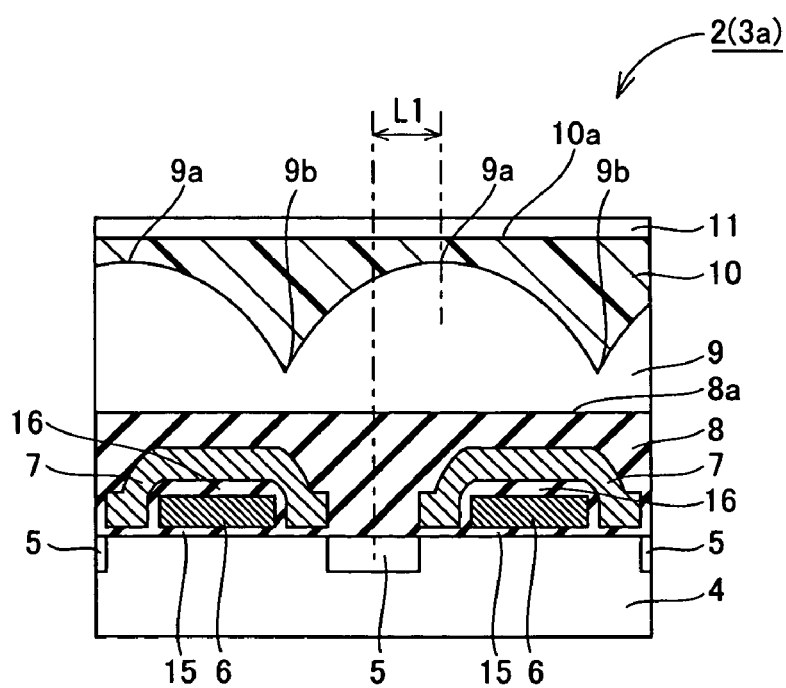
FIG. 2 is a sectional view showing the structure of a pixel part in the vicinity of an end of a photodetection region of the solid-state image pickup device according to the first embodiment shown in FIG. 1.
Figure 3:
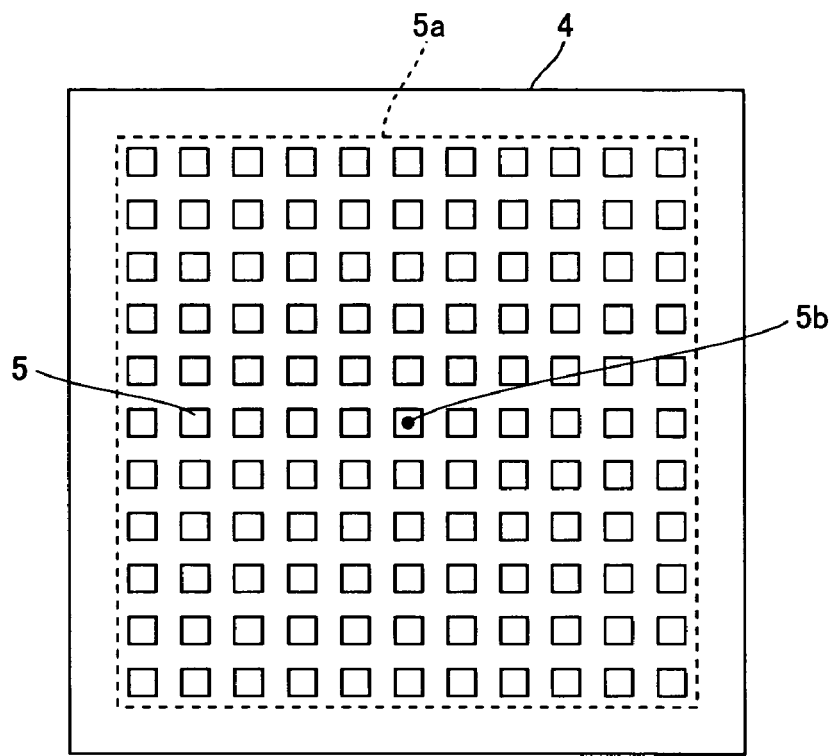
FIG. 3 is a model diagram for illustrating the structure of the photodetection region of the solid-state image pickup device according to the first embodiment shown in FIG. 1.
Figure 4:
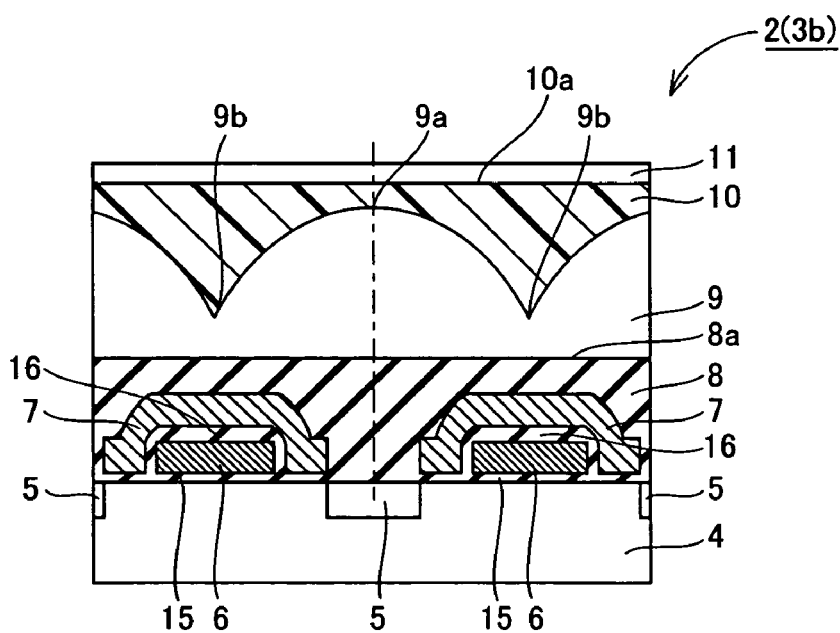
FIG. 4 is a sectional view showing the structure of another pixel part at the central portion of the photodetection region of the solid-state image pickup device according to the first embodiment shown in FIG. 1.

According to the first embodiment, the lens center 9a of each lens 9 is deviated from the center of the corresponding photodetection part 5 by a prescribed distance L1 in a pixel 3a in the vicinity of an end of the photodetection region 5a (see FIG. 3), as shown in FIG. 2. In a pixel 3b at the central portion of the photodetection region 5a (see FIG. 3), on the other hand, the lens center 9a of each lens 9 coincides with the center of the corresponding photodetection part 5, as shown in FIG. 4. The deviation between the lens centers 9a of the lenses 9 and the centers of the photodetection parts 5 is gradually increased from the vicinity of the central portion of the photodetection region 5a (see FIG. 3) toward ends of the photodetection region 5a along the direction of arrangement of the plurality of photodetection parts 5. At an intermediate position between the center and each end of the photodetection region 5a, therefore, the deviation between the lens center 9a of each lens 9 and the center of the corresponding photodetection part 5 is at the intermediate level between the deviation (0: see FIG. 4) at the central portion of the photodetection region 5a and the deviation (L1: see FIG. 2) in the vicinity of each end of the photodetection region 5a. In all regions of the photodetection region 5a, the deviation between the lens center 9a of each lens 9 and the center of the corresponding photodetection part 5 is set to not more than about 500 nm.

Figure 5:
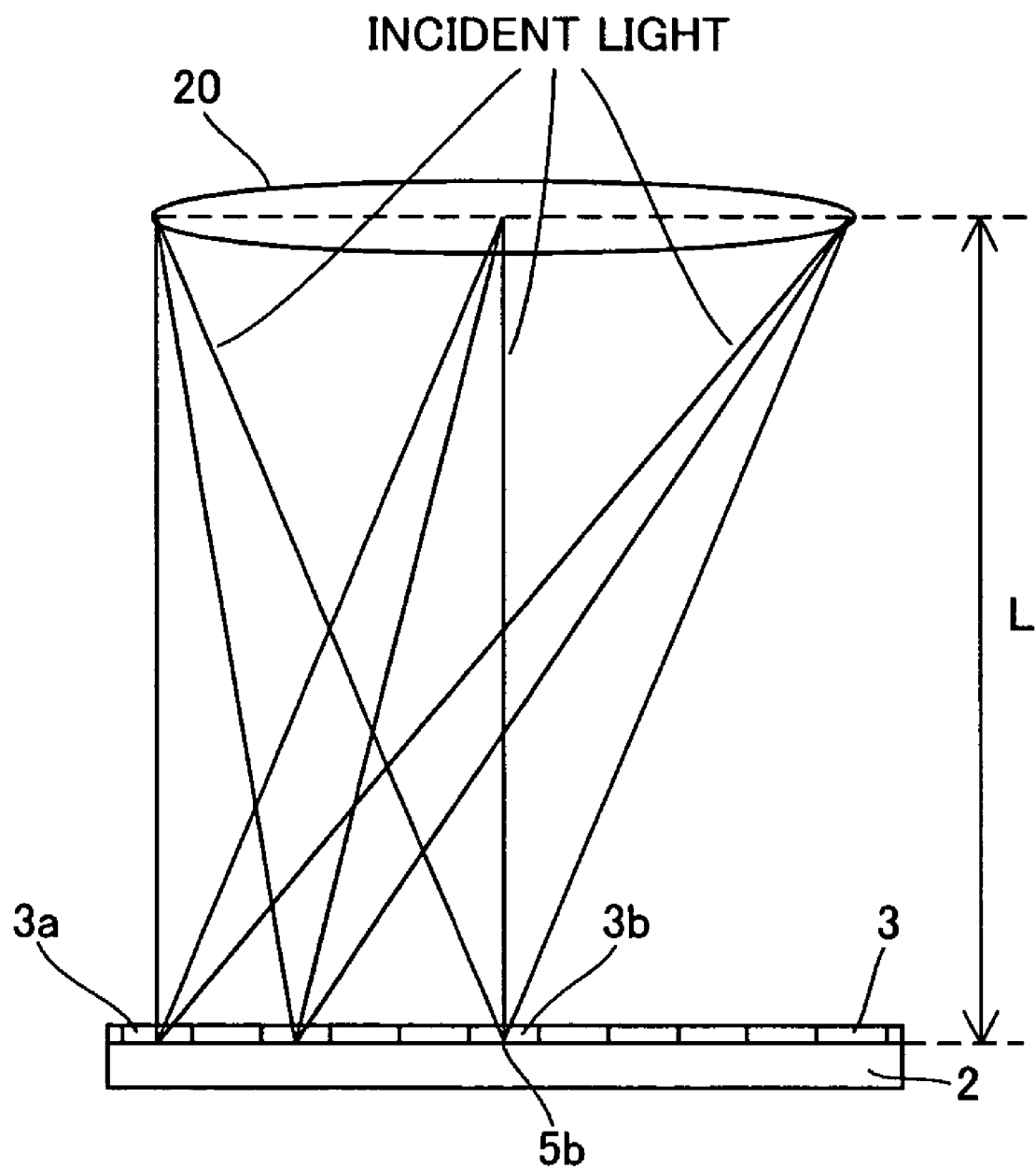
FIG. 5 is a model diagram showing the structure of an exit pupil in the solid-state image pickup device according to the first embodiment shown in FIG. 1.
Figure 6:
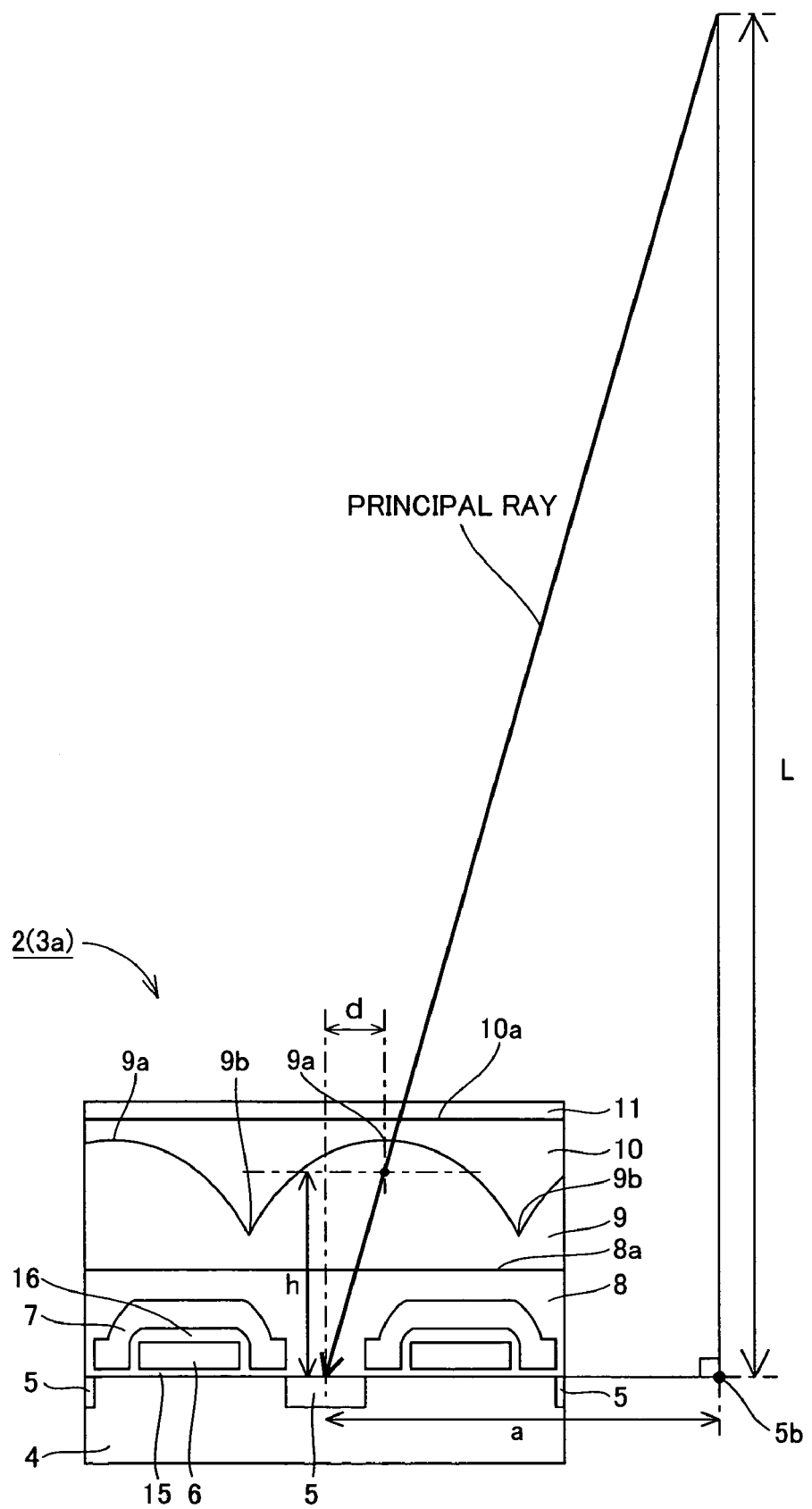
FIG. 6 is a model diagram for illustrating the deviation of a lens in the solid-state image pickup device according to the first embodiment shown in FIG. 1.

According to the first embodiment, the deviation d (see FIG. 6) between the lens center 9a of each lens 9 and the center of the corresponding photodetection part 5 is set according to the following expression (1). Referring to the following expression (1), L represents the distance between each photodetection part 5 and an exit pupil 20 (see FIG. 5), h represents an arbitrary distance larger than the distance between the vertical position of the upper surfaces of the photodetection parts 5 and the vertical position of the boundaries 9b between the adjacent pairs of lenses 9 and smaller than the distance between the vertical position of the upper surfaces of the photodetection parts 5 and the vertical position of the lens centers 9a of the lenses 9, and a represents the distance between the center of an arbitrary photodetection part 5 in the photodetection region 5a and the center 5b of the photodetection region 5a. The exit pupil 20 (see FIG. 5) is an image of the aperture stop 1c (see FIG. 1) formed by the optical lens 1b arranged closer to the solid-state image sensor 2 than the aperture stop 1c.

$$d = a \times h / L \tag{1}$$

According to the first embodiment, the plurality of lenses 9 consist of a single continuous layer. Thus, adjacent pairs of the lenses 9 can be so inhibited from forming gaps therebetween as to suppress failure in condensation of incident light on any photodetection part 5 due to a gap region between an adjacent pair of lenses 9 also when the lens centers 9a of the plurality of lenses 9 are remarkably deviated from the centers of the corresponding photodetection parts 5 in correspondence to remarkably obliquely inclined incident light, dissimilarly to a case of discontinuously arranging the plurality of lenses 9 at prescribed intervals (gaps).

As shown in FIG. 2, a resin layer 10 of acrylic resin or the like having excellent transparency and coverage is formed to cover the upwardly convexed upper surface parts of the lenses 9. This resin layer 10 is formed to have a flat upper surface 10a. A color filter layer 11 having a thickness of about 300 nm to about 1000 nm is formed to be in contact with the flat upper surface 10a of the resin layer 10. This color filter layer 11 is made of a photosensitive resin material containing three pigments of R (red), G (green) and B (blue). Thus, the lenses 9 are arranged between the color filter layer 11 and the semiconductor substrate 4 according to the first embodiment.

Figure 7:
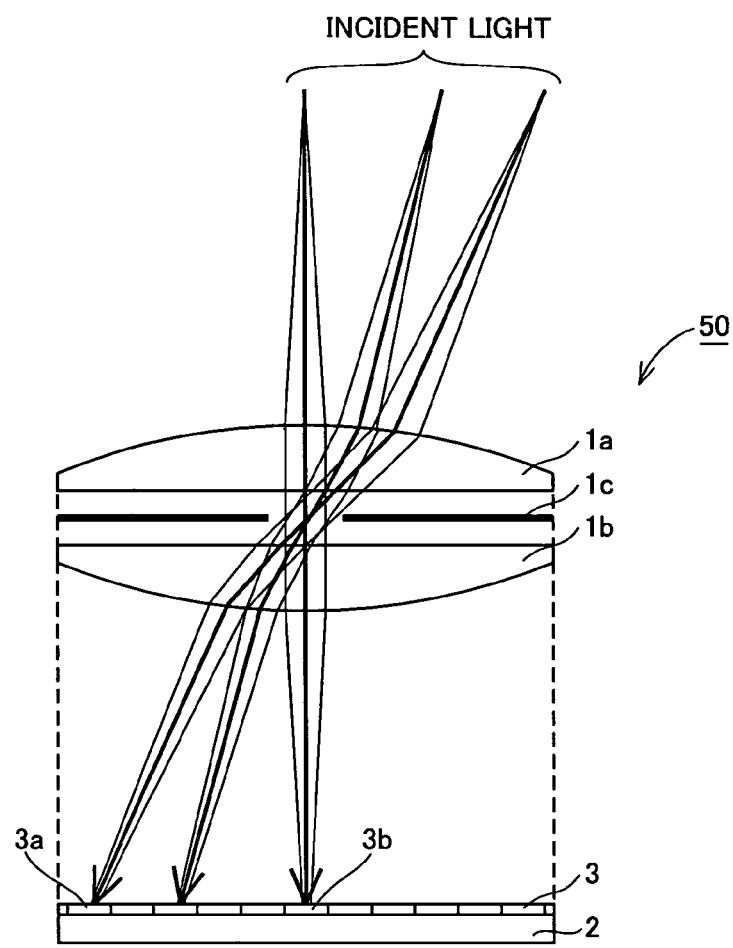
FIG. 7 is a model diagram showing a path of incidence of light upon the solid-state image pickup device according to the first embodiment shown in FIG. 1.
Figure 8:
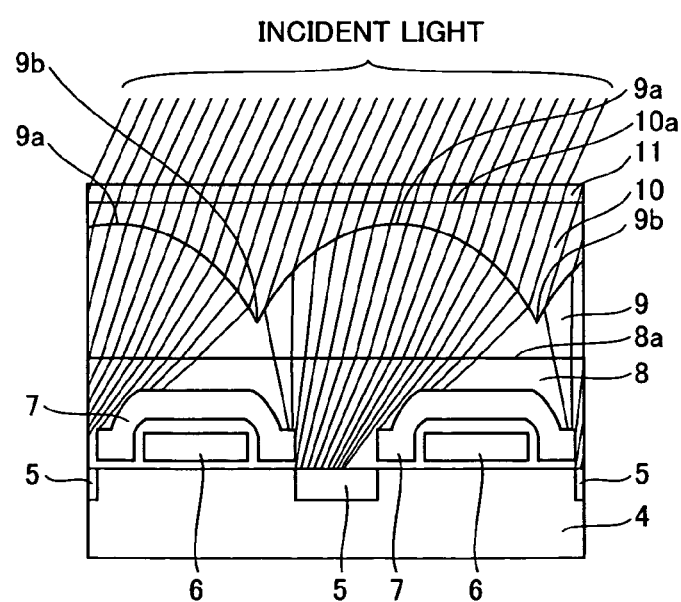
FIG. 8 is a model diagram showing a path of incidence of light upon a solid-state image sensor of the solid-state image pickup device according to the first embodiment shown in FIG. 1.
Figure 9:
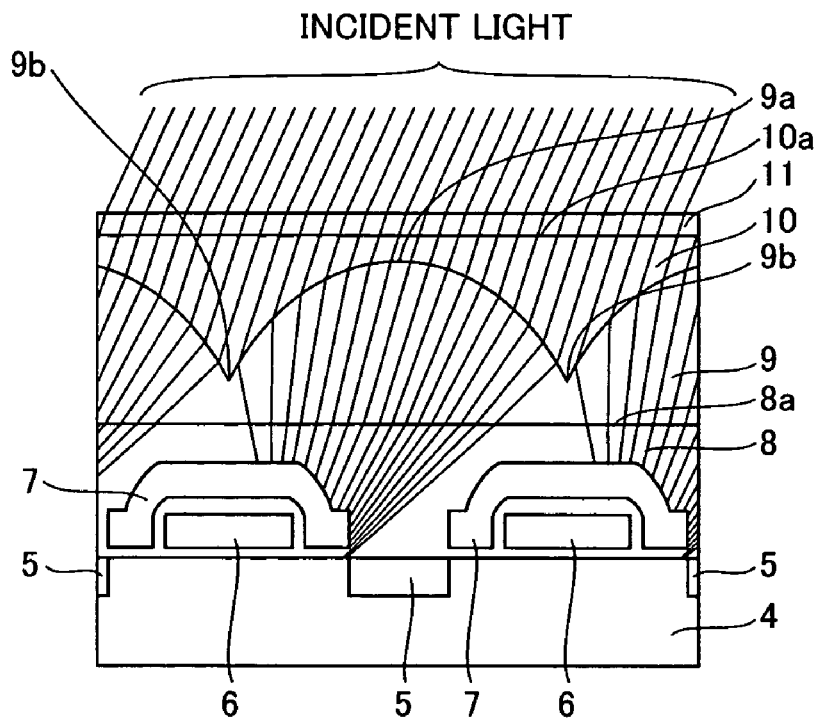
FIG. 9 is a sectional view showing a comparative example for illustrating effects of the solid-state image pickup device according to the first embodiment shown in FIG. 1.

According to the first embodiment, the deviation between the lens center 9a of each lens 9, formed between the semiconductor substrate 4 and the color filter layer 11, located in the vicinity of each end of the photodetection region 5a and the center of the corresponding photodetection part 5 is rendered larger than that between the lens center 9a of each lens 9 located in the vicinity of the central portion of the photodetection region 5a and the center of the corresponding photodetection part 5 as hereinabove described so that light obliquely incident upon each lens 9 can be focused on the corresponding photodetection part 5 as shown in FIG. 8 also when the light obliquely entering the solid-state image pickup device 50 is obliquely incident upon the solid-state image sensor 2 as shown in FIG. 7, whereby more obliquely incident light can be effectively condensed on the photodetection part 5 located in the vicinity of each end of the photodetection region 5a as compared with that located the vicinity of the central portion of the photodetection region 5a and approximately vertical light can be condensed on the photodetection part 5 in the vicinity of the central portion of the photodetection region 5a. Thus, condensation efficiency for the photodetection parts 5 can be improved both in the vicinities of the center and the ends of the photodetection region 5a, whereby the solid-state image pickup device 50 having the lenses 9 provided between the semiconductor substrate 4 and the color filter layer 11 can be improved in photosensitivity. If the lens centers 9a of the lenses 9 are arranged with no deviation from the centers of the photodetection parts 5, light obliquely incident upon the solid-state image sensor 2 cannot be focused on the photodetection parts 5 as shown in FIG. 9 and hence it is difficult to condense the obliquely incident light on the photodetection parts 5.

According to the first embodiment, the plurality of lenses 9 are so constituted of the single continuous layer as to suppress failure in condensation of incident light on any photodetection part 5 due to a gap region between an adjacent pair of lenses 9 also when the lens centers 9a of the plurality of lenses 9 are remarkably deviated from the centers of the corresponding photodetection parts 5 in correspondence to remarkably obliquely inclined incident light, dissimilarly to a case of discontinuously arranging the plurality of lenses 9 at prescribed intervals (gaps). Thus, the condensation efficiency for the photodetection parts 5 can be inhibited from reduction also when the lens centers 9a of the plurality of lenses 9 are remarkably deviated from the centers of the corresponding photodetection parts 5 in order to condense remarkably obliquely inclined light on the photodetection parts 5.

According to the first embodiment, the deviation between the lens centers 9a of the lenses 9 and the centers of the photodetection parts 5 is so gradually increased from the vicinity of the central portion of the photodetection region 5a toward the ends of the photodetection region 5a along the direction of arrangement of the plurality of photodetection parts 5 that light having an angle of incidence gradually increased from the vicinity of the central portion of the photodetection region 5a toward the ends of the photodetection region 5a along the direction of arrangement of the plurality of photodetection parts 5 can be effectively condensed on the photodetection parts 5 in response to the angle of incidence. Thus, the condensation efficiency for the photodetection parts 5 can be improved along the overall region of the photodetection region 5a including the vicinities of the center and the ends thereof.

According to the first embodiment, the resin layer 10 having the flat upper surface 10a is formed to cover the upwardly convexed upper surface parts of the lenses 9 while the color filter layer 11 is formed on the flat upper surface 10a of the resin layer 10 so that the color filter layer 11 can be formed on the flat upper surface 10a with no influence by the convexed upper surface parts of the lenses 9, whereby the color filter layer 11 can be easily formed on the upwardly convexed lenses 9.

A manufacturing process for the solid-state image sensor 2 according to the first embodiment of the present invention is now described with reference to FIGS. 2 to 6 and 10 to 15.

Figure 10:
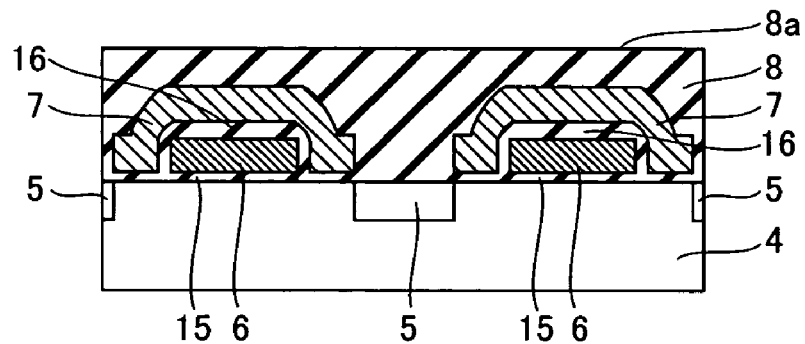
FIGS. 10 to 12 are sectional views for illustrating a manufacturing process for the solid-state image sensor according to the first embodiment of the present invention.

As shown in FIG. 10, the transfer gates 6 of polysilicon are formed on the prescribed regions of the surface of the semiconductor substrate 4 formed with the photodetection region 5a (see FIG. 3) consisting of the plurality of photodetection parts 5 through the insulator films 15. Further, the shielding members 7 of the metal material such as Al are formed to cover the upper portions of the transfer gates 6 through the insulator films 16. Thereafter the flattened film 8 consisting of the silicon oxide film is formed to cover the shielding members 7. Thereafter the upper surface of the flattened film 8 is flattened by CMP (chemical mechanical polishing). Thus, the flattened upper surface 8a of the flattened film 8 is formed on the vertical position of about 100 nm to about 800 nm from the upper surfaces of the shielding member 7.

Figure 11:
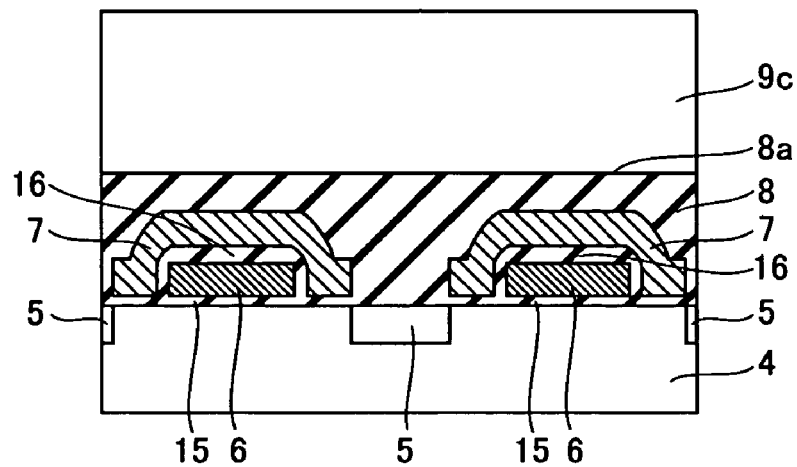

As shown in FIG. 11, an SiN film 9c having a thickness of about 500 nm to about 800 nm is formed on the upper surface 8a of the flattened film 8 by CVD (chemical vapor deposition).

Figure 12:
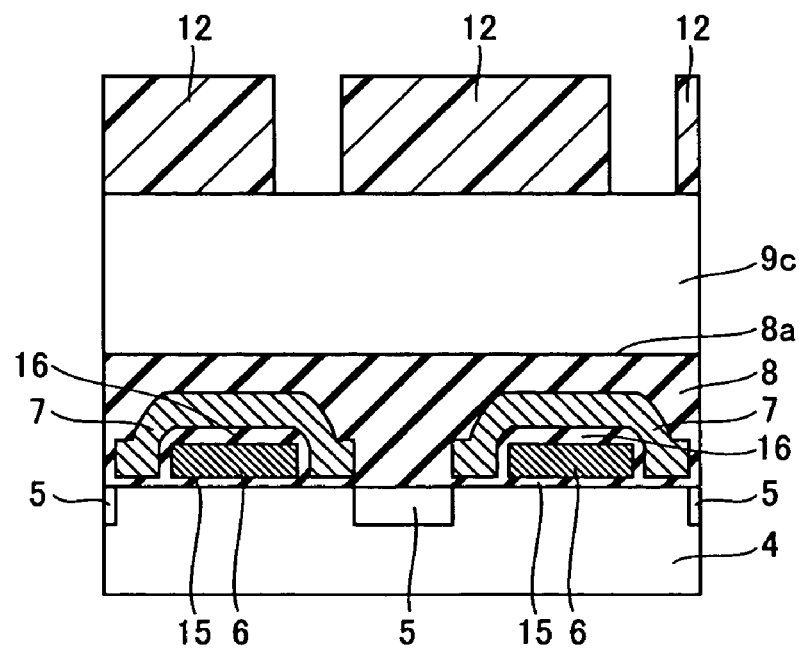
Figure 13:
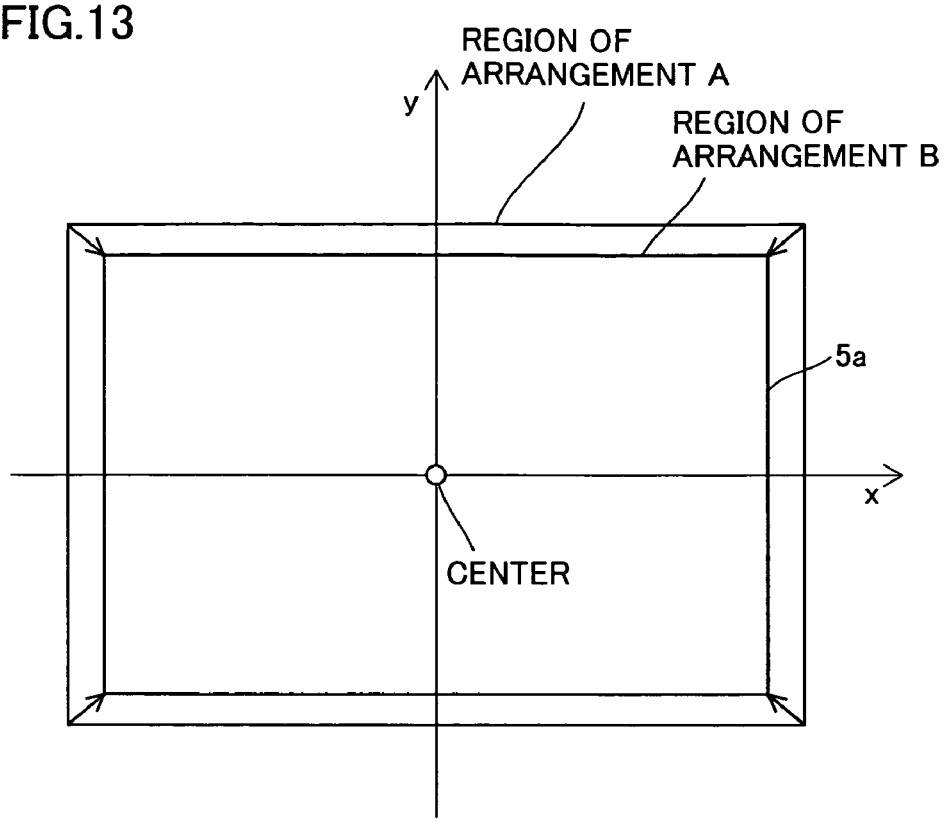
FIG. 13 is a model diagram for illustrating a process of forming the lens in a deviational manner in the solid-state image pickup device according to the first embodiment of the present invention.

As shown in FIG. 12, photoresist films 12 are formed on prescribed regions of the SiN film 9c by lithography. At this time, the photoresist films 12 are so patterned that the deviation between the centers of the photoresist films 12 and those of the photodetection parts 5 is gradually increased from the vicinity of the central portion of the photodetection region 5a (see FIG. 3) toward the vicinities of the ends of the photodetection region 5a along the direction of arrangement of the plurality of photodetection parts 5 according to the first embodiment. The deviation between the centers of the photoresist films 12 and those of the photodetection parts 5 is set to not more than about 500 nm according to the above expression (1). More specifically, a region of arrangement A where the lens centers 9a (see FIG. 6) and the centers of the photodetection parts 5 coincide with each other is set as shown in FIG. 13. The convex shape of each lens 9 in the set arrangement A is reduced at a prescribed ratio for inwardly deviating the lens center 9a (see FIG. 6) from the center of the corresponding photodetection part 5 by the deviation d (see FIG. 6), thereby setting a region of arrangement B. At this time, it is assumed that the coordinates of the lens center 9a of a prescribed lens 9 in the arrangement A having the origin at the center of the region of the arrangement A are $(x_0, y_0)$, the distance L (see FIG. 6) in the above expression (1) is 12 mm, and the distance h (see FIG. 6) is 3 μm. In this case, the deviation d between the lens center 9a of the corresponding lens 9 in the arrangement B and the center of the corresponding photodetection part 5 is $(-x_0 \times 3/12000)$ in the x-axis direction and $(-y_0 \times 3/12000)$ in the y-axis direction. Thus, the coordinates of the lens center 9a of the corresponding lens 9 in the region of the arrangement B are set to $(x_0 - x_0 \times 3/12000, y_0 - y_0 \times 3/12000)$. Therefore, the photoresist films 12 can be patterned for forming the lenses 9 to have the deviation d from the centers of the photodetection parts 5 by setting the coordinates of the origin and the coordinates $(x_0 - x_0 \times 3/12000, y_0 - y_0 \times 3/12000)$ of the centers of the photoresist films 12.

When the diagonal length of the photodetection region 5a (see FIG. 13) is set to about 3950 μm, for example, a diagonal position most separated from the central portion of the photodetection region 5a is at a distance of about 1975 μm from the center. Thus, the deviation d between the lens center 9a of the lens 9 (see FIG. 6) and the center of the corresponding photodetection part 5 on this diagonal position is calculated as follows:

1975×3/12000=0.494 μm

When the diagonal length of the photodetection region 5a is set to about 3950 μm, therefore, the center of the photoresist film 12 (see FIG. 12) corresponding to the lens center 9a of the lens 9 located on the diagonal position is deviated toward the central portion of the photodetection region 5a (see FIG. 13) by about 0.494 μm in order to deviate the lens center 9a toward the central portion of the photodetection region 5a by about 0.494 μm.

Figure 14:
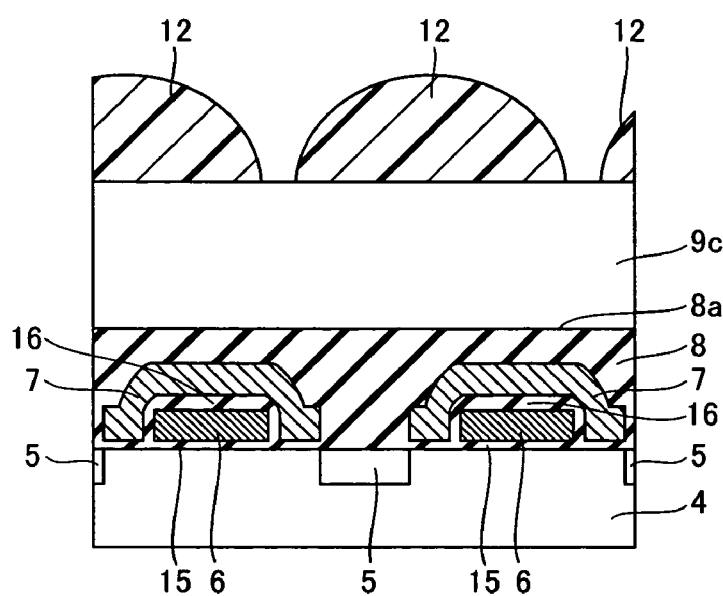
FIGS. 14 and 15 are sectional views for illustrating the manufacturing process for the solid-state image sensor according to the first embodiment of the present invention.
Figure 15:
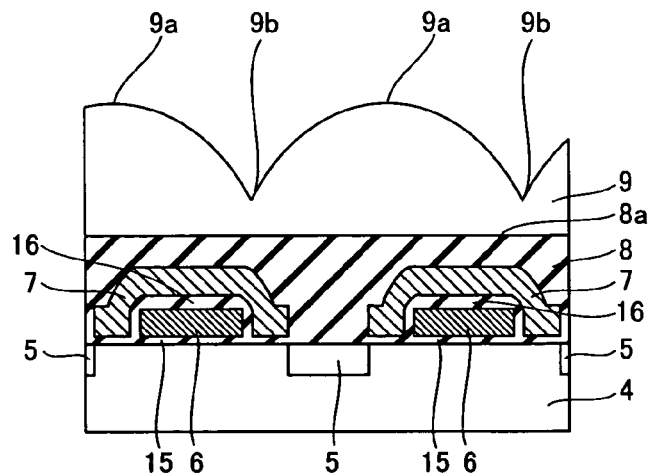

Then, heat treatment is performed on a hot plate at a temperature of about 160° C. for about 2 minutes, thereby improving flowability of the photoresist films 12. Thus, the photoresist films 12 are upwardly convexed due to surface tension, as shown in FIG. 14. At this time, an interval of about 0.2 μm is provided between each adjacent pair of the upwardly convexed photoresist films 12. Then, the upwardly convexed photoresist films 12 and the SiN film 9c are simultaneously etched thereby forming the plurality of upwardly convexed lenses 9 reflecting the upwardly convexed shapes of the photoresist films 12, as shown in FIG. 15. The plurality of lenses 9 are prepared from the single continuous layer. Specific etching conditions for this step are $CF_4$ gas of about 5 ccm to about 25 sccm, $O_2$ gas of about 5 sccm to about 30 sccm and Ar gas of about 50 sccm to about 150 sccm, RF power of about 500 W to about 1000 W and a gas pressure of about 2.6 Pa to about 10.7 Pa. Thus, the lenses 9 are so formed that the deviation between the lens centers 9a of the lenses 9 and the centers of the photodetection parts 5 is gradually increased from the vicinity of the central portion of the photodetection region 5a (see FIG. 3) toward the ends of the photodetection region 5a along the direction of arrangement of the plurality of photodetection parts 5.

Then, the resin layer 10 of acrylic resin or the like having excellent transparency and coverage with the flat upper surface 10a (see FIG. 2) is formed to fill up the boundaries 9b between the adjacent pairs of the convexed lenses 9. This resin layer 10 is formed by spin coating by applying a resin material such as acrylic resin onto the lenses 9 and thereafter rotating the solid-state image sensor 2 about a vertical axis thereby spreading the resin material on the overall surfaces of the lenses 9. At this time, the solid-state image sensor 2 is set to a rotational frequency for forming a resin material film of about 500 nm to about 1500 nm in thickness on a flat substrate when applying the resin material onto this substrate and rotating the same. Thereafter the color filter layer 11 having the thickness of about 300 nm to about 1000 nm is formed on the upper surface 10a of the resin layer 10 by performing exposure and development with the photosensitive resin material containing the three pigments of red, green and blue. Thus, the solid-state image sensor 2 of the solid-state image pickup device 50 according to the first embodiment is formed as shown in FIGS. 2 and 3.

Second Embodiment

A second embodiment of the present invention is applied to a solid-state image sensor 22 of a frame transfer CCD, dissimilarly to the aforementioned first embodiment.

Figure 16:
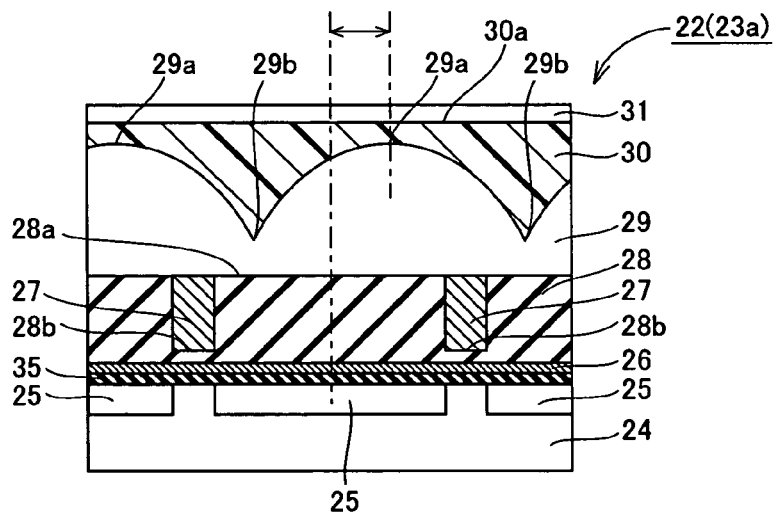
FIG. 16 is a sectional view showing the structure of a pixel part in the vicinity of an end of a photodetection region of a solid-state image sensor according to a second embodiment of the present invention.

In the solid-state image sensor 22 according to the second embodiment, a plurality of photodetection parts 25 having photoelectric conversion functions of converting incident light to charge signals are formed on prescribed regions of the surface of a semiconductor substrate 24, as shown in FIG. 16. These plurality of photodetection parts 25 form a photodetection region 5a (see FIG. 3), similarly to the aforementioned first embodiment. The plurality of photodetection parts 25 are arranged at intervals of about 0.3 μm to about 3 μm respectively. A transfer gate 26 of polysilicon is formed on the semiconductor substrate 24 formed with the photodetection parts 25 through an insulator film 35. A flattened film 28 is formed to cover the transfer gate 26. This flattened film 28 is formed by a silicon oxide film having excellent coverage and light transmissibility.

Figure 17:
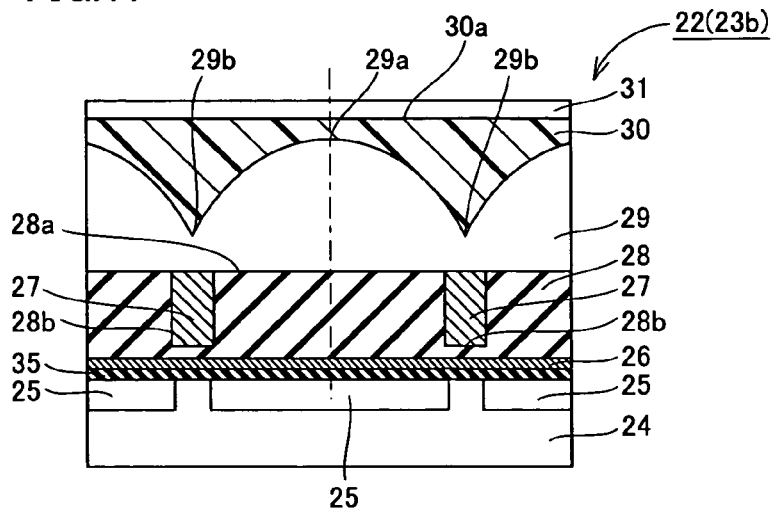
FIG. 17 is a sectional view showing the structure of another pixel part in the vicinity of the central portion of the photodetection region of the solid-state image sensor according to the second embodiment of the present invention.

According to the second embodiment, shielding members 27 consisting of W or the like are formed to fill up grooves 28b formed in the flattened film 28. Thus, the side surfaces and the bottom surfaces of the shielding members 27 are covered with the flattened film 28. Further, the upper ends of the shielding members 27 and the upper surface of the flattened film 28 are rendered flush with each other. Thus, a flat surface 28a is formed by the upper ends of the shielding members 27 and the upper surface of the flattened film 28. A plurality of lenses 29 similar in structure to the lenses 9 (see FIGS. 2 and 3) according to the aforementioned first embodiment are formed on the flat surface 28a. The plurality of lenses 29 consist of a single continuous layer. Each lens 29 has a lens center 29a deviated from the center of the corresponding photodetection part 25 by a prescribed distance in a pixel 23a located in the vicinity of each end of the photodetection region 5a (see FIG. 3) as shown in FIG. 16, while each lens 29 has a lens center 29a coinciding with the center of the corresponding photodetection part 25 in a pixel 23b located at the central portion of the photodetection part 5a (see FIG. 3) as shown in FIG. 17. The deviation between the lens centers 29a of the lenses 29 and the centers of the corresponding photodetection parts 25 is gradually increased from the vicinity of the central portion of the photodetection region 5a (see FIG. 3) toward the vicinities of the ends of the photodetection region 5a (see FIG. 3) along the direction of arrangement of the plurality of photodetection parts 25. The deviation is set to the deviation d calculated according to the above expression (1). Further, the deviation between the lens centers 29a of the lenses 29 and the centers of the corresponding photodetection parts 25 is rendered not more than about 500 nm along the overall region of the photodetection region 5a. The remaining structure of the solid-state image sensor 22 according to the second embodiment is similar to that of the solid-state image sensor 2 according to the aforementioned first embodiment.

According to the second embodiment, as hereinabove described, the deviation between the lens center 29a of each lens 29, formed between the semiconductor substrate 24 and the color filter layer 31, located in the vicinity of each end of the photodetection region 5a and the center of the corresponding photodetection part 25 is rendered larger than that between the lens center 29a of each lens 29 located in the vicinity of the central portion of the photodetection region 5a and the center of the corresponding photodetection part 25, whereby more obliquely incident light can be effectively condensed on the photodetection part 25 in the vicinity of each end of the photodetection region 5a as compared with that located in the vicinity of the central portion of the photodetection region 5a and approximately vertical light can be condensed on the photodetection part 25 in the vicinity of the central portion of the photodetection region 5a. Thus, condensation efficiency for the photodetection parts 25 can be improved both in the vicinities of the center and the ends of the photodetection region 5a, whereby a solid-state image pickup device having the lenses 29 provided between the semiconductor substrate 24 and the color filter layer 31 can be improved in photosensitivity.

The remaining effects of the second embodiment are similar to those of the aforementioned first embodiment.

A manufacturing process for the solid-state image sensor 22 according to the second embodiment of the present invention is now described with reference to FIGS. 16 to 21.

Figure 18:
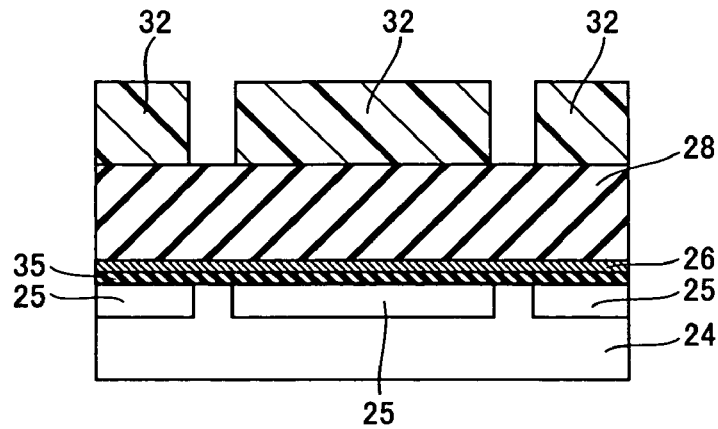
FIGS. 18 to 21 are sectional views for illustrating a manufacturing process for the solid-state image sensor according to the second embodiment of the present invention.

According to the second embodiment, the insulator film 35 and the transfer gate 26 of polysilicon are formed in this order to cover the upper surface of the semiconductor substrate 24 formed with the photodetection region 5a (see FIG. 3) consisting of the photodetection parts 25, as shown in FIG. 18. The flattened film 28 consisting of the silicon oxide film is formed to cover the transfer gate 26, and the upper surface of the flattened film 28 is thereafter flattened by CMP. Photoresist films 32 are formed on prescribed regions of the flattened upper surface of the flattened film 28.

Figure 19:
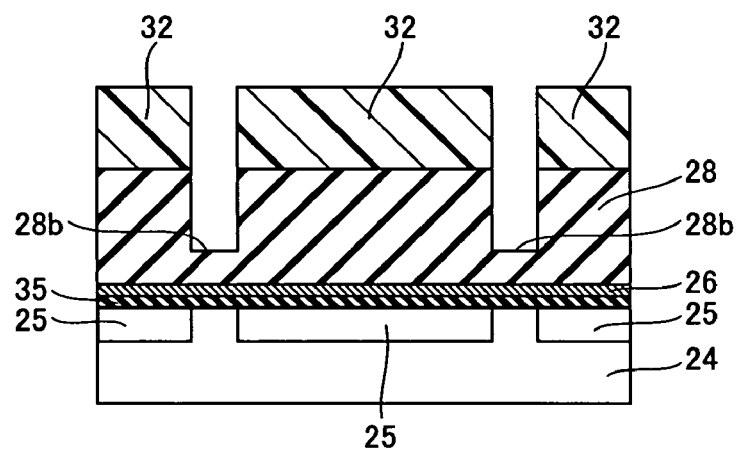

As shown in FIG. 19, the photoresist films 32 are employed as masks for etching the flattened film 28 by a prescribed thickness thereby forming the grooves 28b. Thereafter the photoresist films 32 are removed from the flattened film 28.

Figure 20:
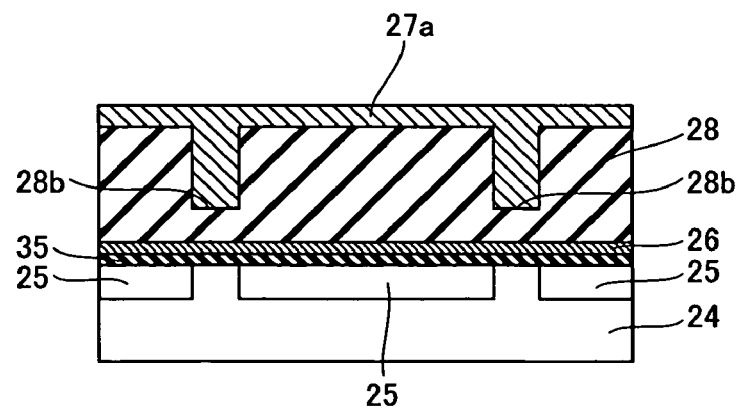
Figure 21:
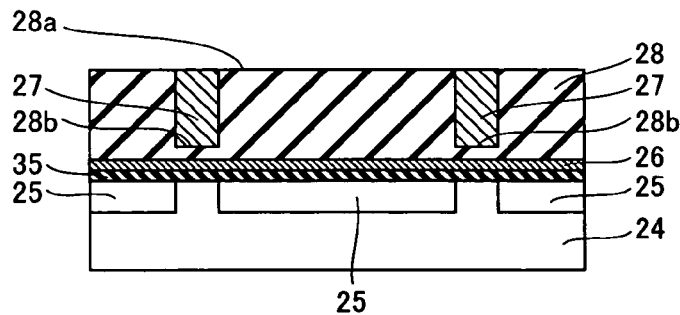

As shown in FIG. 20, a metal layer 27a consisting of W or the like is formed to fill up the grooves 28b of the flattened film 28 and extend on the upper surface of the flattened film 28. Excess portions of the metal layer 27a are polished by MP thereby forming the shielding members 27 consisting of W or the like while rendering the upper ends of the shielding members 27 and the upper surface of the flattened film 28 flush with each other, as shown in FIG. 21. Thus, the flat surface 28a is formed by the upper ends of the shielding members 27 and the upper surface of the flattened film 28. Thereafter the lenses 29, the resin layer 30 and the color filter layer 31 are formed as shown in FIGS. 16 and 17 through a manufacturing process similar to that according to the aforementioned first embodiment.

Third Embodiment

In a solid-state image sensor 42 according to a third embodiment of the present invention, lenses 49 are downwardly convexed dissimilarly to the aforementioned first and second embodiments. The structure of the solid-state image sensor 42 according to the third embodiment of the present invention is now described with reference to FIGS. 22 and 23.

Figure 22:
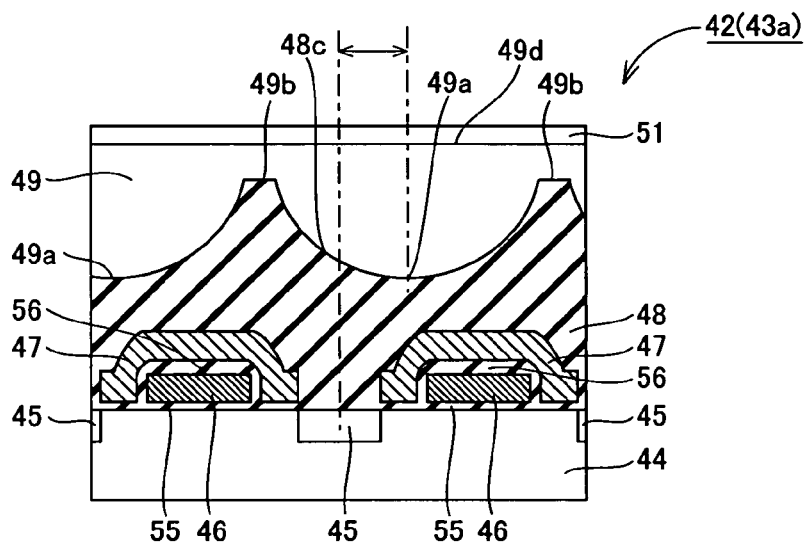
FIG. 22 is a sectional view showing the structure of a pixel part in the vicinity of an end of a photodetection region of a solid-state image sensor according to a third embodiment of the present invention.
Figure 23:
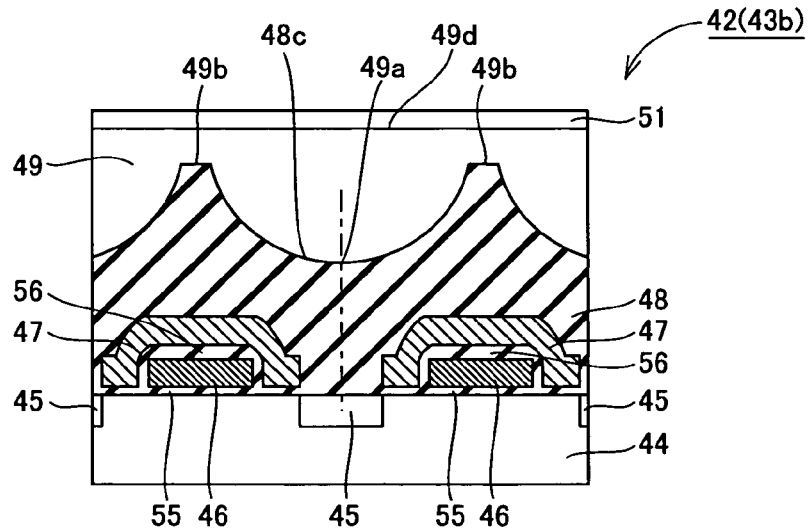
FIG. 23 is a sectional view showing the structure of another pixel part in the vicinity of the central portion of the photodetection region of the solid-state image sensor according to the third embodiment of the present invention.

In the solid-state image sensor 42 according to the third embodiment, transfer gates 46 of polysilicon are formed on the surface of a semiconductor substrate 44 having a photodetection region 5a (see FIG. 3) consisting of a plurality of photodetection parts 45 through insulator films 55, as shown in FIG. 22. Further, shielding members 47 of a metal such as Al are formed to cover the transfer gates 46 through insulator films 56. An insulator film 48 consisting of a silicon oxide film is formed to cover the shielding members 47. The upper surface of this insulator film 48 has recess portions 48c. The plurality of downwardly convexed lenses 49 consisting of SiN are formed to fill up the recess portions 48c of the insulator film 48. The plurality of lenses 49 consist of a single continuous layer. Each lens 49 has a lens center 49a deviated from the center of the corresponding photodetection part 45 by a prescribed distance in a pixel 43a located in the vicinity of each end of the photodetection region 5a (see FIG. 3) as shown in FIG. 22, while each lens 49 has a lens center 49a coinciding with the center of the corresponding photodetection part 45 in a pixel 43b located at the central portion of the photodetection region 5a (see FIG. 3) as shown in FIG. 23. The deviation between the lens centers 49a of the lenses 49 and the centers of the corresponding photodetection parts 45 is gradually increased from the vicinity of the central portion of the photodetection region 5a (see FIG. 3) toward the vicinities of the ends of the photodetection region 5a (see FIG. 3) along the direction of arrangement of the plurality of photodetection parts 45. The deviation between the lens centers 49a of the lenses 49 and the centers of the corresponding photodetection parts 45 is rendered not more than about 500 nm along the overall region of the photodetection region 5a. The lenses 49 have flattened upper surfaces 49d, while a color filter layer 51 having a thickness of about 300 nm to about 1000 nm is formed on the flattened upper surfaces 49d of the lenses 49. The remaining structure of the solid-state image sensor 42 according to the third embodiment is similar to that of the solid-state image sensor 2 (see FIGS. 2 and 4) according to the aforementioned first embodiment.

According to the third embodiment, as hereinabove described, the deviation between the lens center 49a of each lens 49, formed between the semiconductor substrate 44 and the color filter layer 51, located in the vicinity of each end of the photodetection region 5a and the center of the corresponding photodetection part 45 is rendered larger than that between the lens center 49a of each lens 49 located in the vicinity of the central portion of the photodetection region 5a and the center of the corresponding photodetection part 45, whereby more obliquely incident light can be effectively condensed on the photodetection part 45 in the vicinity of each end of the photodetection region 5a as compared with that located in the vicinity of the central portion of the photodetection region 5a and approximately vertical light can be condensed on the photodetection part 45 in the vicinity of the central portion of the photodetection region 5a. Thus, condensation efficiency for the photodetection parts 45 can be improved both in the vicinities of the center and the ends of the photodetection region 5a, whereby a solid-state image pickup device having the lenses 49 provided between the semiconductor substrate 44 and the color filter layer 51 can be improved in photosensitivity.

The remaining effects of the third embodiment are similar to those of the aforementioned first embodiment.

A manufacturing process for the solid-state image sensor 42 according to the third embodiment of the present invention is now described with reference to FIGS. 22 to 28.

Figure 24:
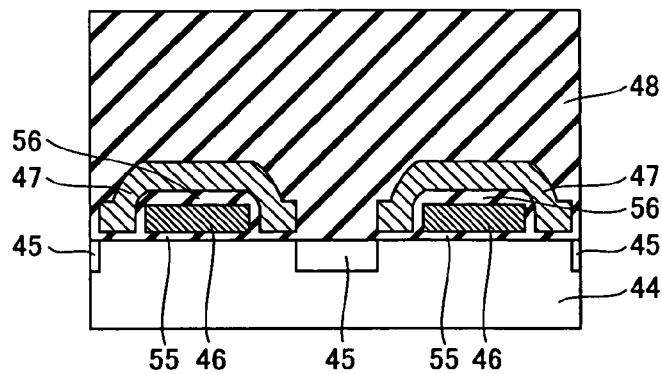
FIGS. 24 to 28 are sectional views for illustrating a manufacturing process for the solid-state image sensor according to the third embodiment of the present invention.

As shown in FIG. 24, the semiconductor substrate 44 having the photodetection region 5a (see FIG. 3) consisting of the plurality of photodetection parts 45, the insulator films 55, the transfer gates 46, the insulator films 56 and the shielding members 47 are so formed that the insulator film 48 consisting of the silicon oxide film is thereafter formed to cover the shielding members 47. The upper surface of the insulator film 48 is flattened by CMP.

Figure 25:
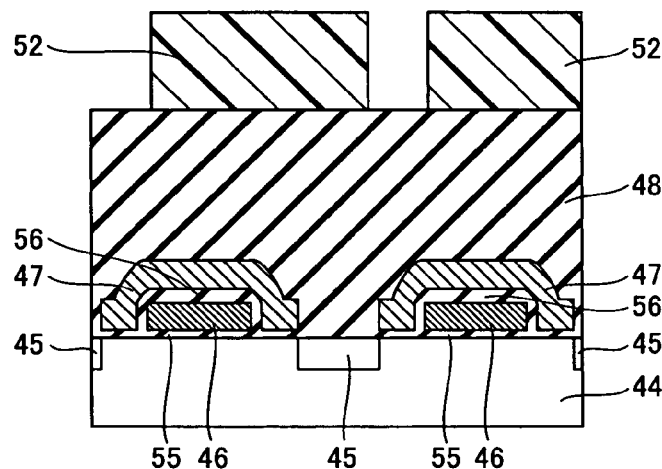

As shown in FIG. 25, photoresist films 52 are formed on prescribed regions of the flattened upper surface of the insulator film 48.

Figure 26:
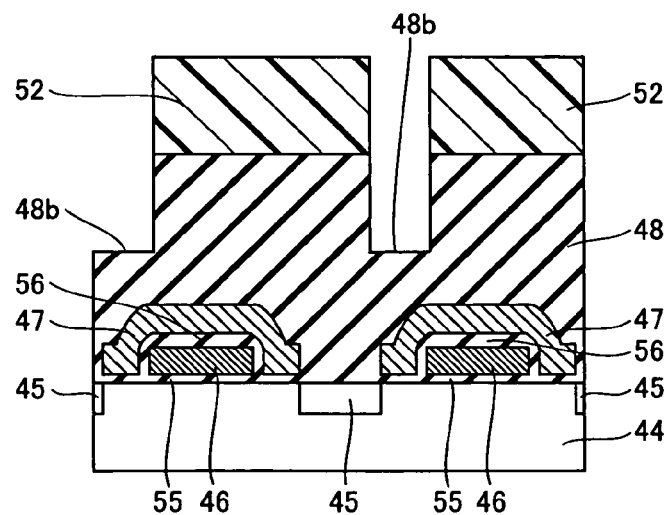

As shown in FIG. 26, the photoresist films 52 are employed as masks for etching the insulator film 48 thereby forming the grooves 48b of about 500 nm in depth. At this time, the photoresist films 52 are so patterned that the deviation between the centers of the grooves 48b and those of the photodetection parts 45 is gradually increased from the vicinity of the central portion of the photodetection region 5a (see FIG. 3) toward the vicinities of the ends of the photodetection region 5a (see FIG. 3) along the direction of arrangement of the plurality of photodetection parts 45 according to the third embodiment.

Figure 27:
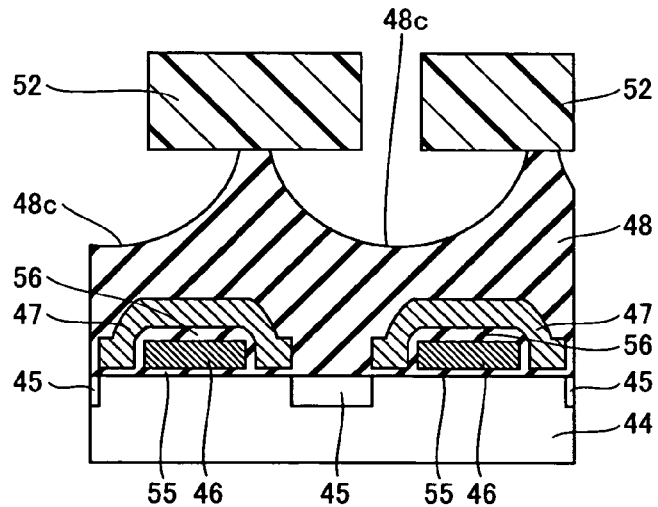

As shown in FIG. 27, wet etching is performed with hydrofluoric acid (HF:H$_2$O=1:100) for 4 minutes, thereby forming the curved recess portions 48c on the upper surface of the insulator film 48. Thereafter the photoresist films 52 are removed.

Figure 28:
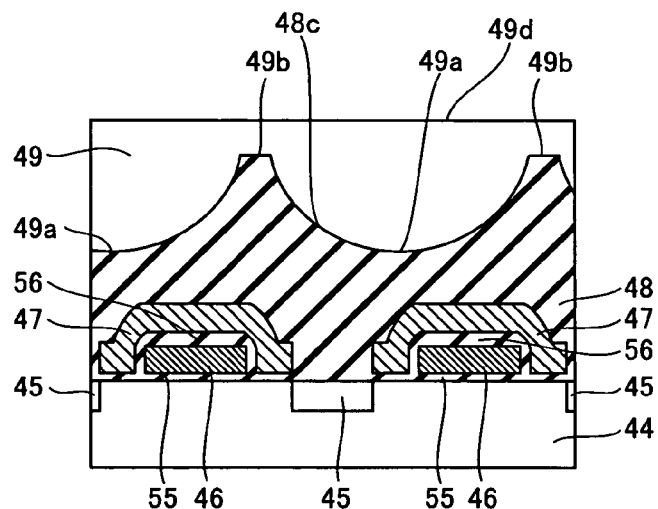
Figure 29:
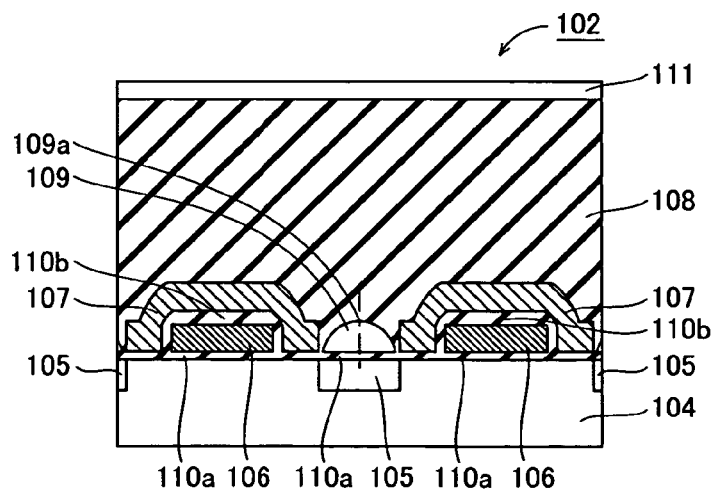
FIG. 29 is a sectional view showing the structure of a solid-state image pickup device according to first exemplary prior art comprising a lens for condensing light on a corresponding photodetection part.
Figure 30:
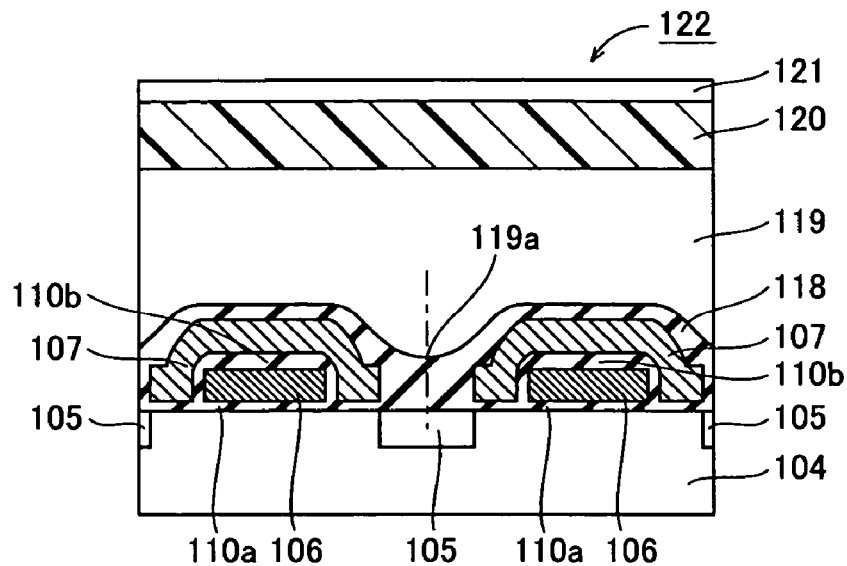
FIG. 30 is a sectional view showing the structure of a solid-state image pickup device according to second exemplary prior art comprising a lens for condensing light on a corresponding photodetection part.
Figure 31:
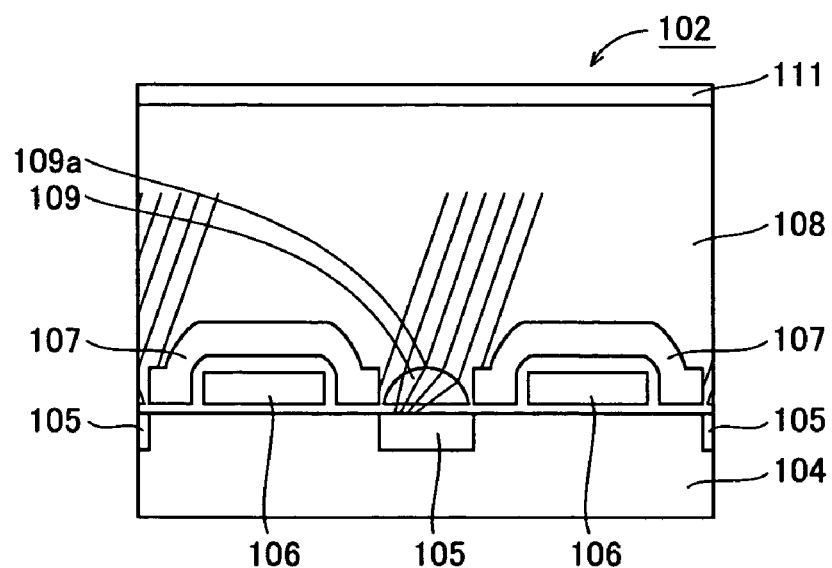
FIG. 31 is a sectional view for illustrating a problem of the solid-state image pickup device according to the first exemplary prior art shown in FIG. 29.
Figure 32:
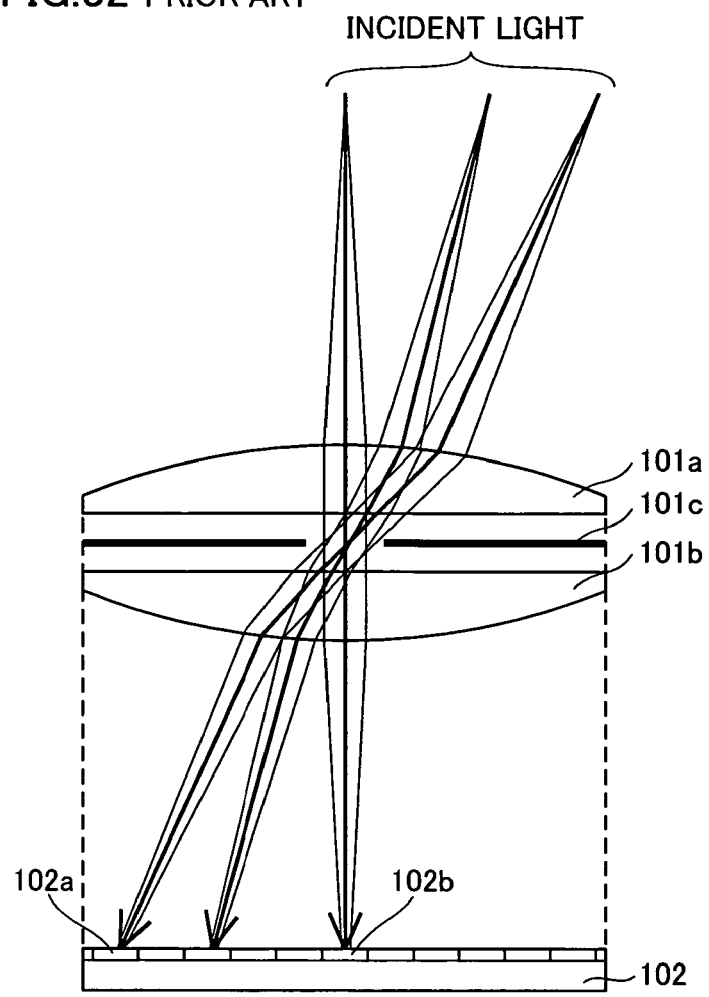
FIG. 32 is a model diagram showing a path of incidence of light upon the solid state image pickup device according to the first exemplary prior art shown in FIG. 29.
Figure 33:
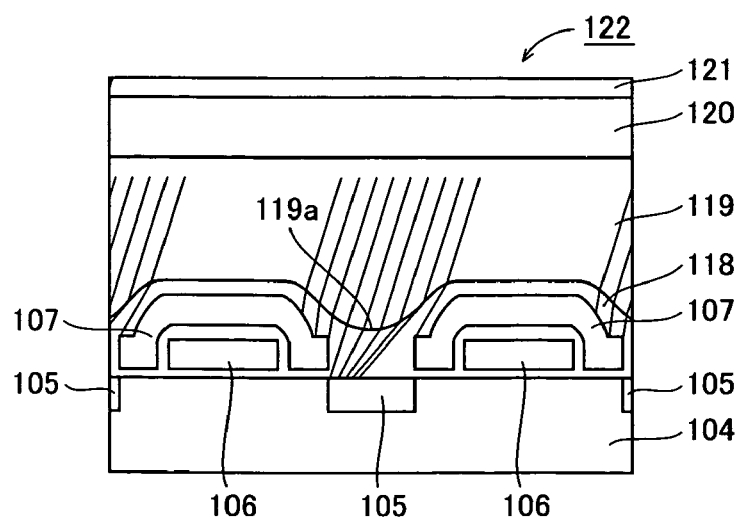
FIG. 33 is a sectional view for illustrating a problem of the solid-state image pickup device according to the second exemplary prior art shown in FIG. 30.

As shown in FIG. 28, the lenses 49 consisting of SiN are formed by CVD to fill up the recess portions 48c of the flattened film 48. At this time, the lenses 49 are so formed that the thickness is about 800 nm to about 1000 nm at the lens centers 49a. Thereafter the upper surfaces 49d of the lenses 49 are flattened by CMP. As shown in FIGS. 22 and 23, a photosensitive resin material containing three pigments of red, green and blue is formed and thereafter subjected to exposure and development thereby forming the color filter layer 51 having three colors of red, green and blue on upper surfaces 49d of the lenses 49. The remaining manufacturing process for the solid-state image sensor 42 according to the third embodiment is similar to that for the solid-state image sensor 2 according to the aforementioned first embodiment.

Although the present invention has been described and illustrated in detail, it is clearly understood that the same is by way of illustration and example only and is not to be taken by way of limitation, the spirit and scope of the present invention being limited only by the terms of the appended claims.

For example, while the upper surface of the flattened film or the insulator film is flattened by CMP in each of the aforementioned first to third embodiments, the present invention is not restricted to this but the upper surface of the flattened film or the insulator film may alternatively be flattened by etching.

While the flattened film or the insulator film consisting of the silicon oxide film is formed in each of the aforementioned first to third embodiments, the present invention is not restricted to this but the flattened film or the insulator film may alternatively consist of a silicon nitride film.

While only the lenses (inner lenses) formed between the color filter layer and the semiconductor substrate are provided as the lenses for condensing light on the photodetection parts in each of the aforementioned first to third embodiments, the present invention is not restricted to this but microlenses having a plurality of projecting portions corresponding to the respective photodetection parts may further be provided on the color filter layer in addition to the lenses (inner lenses) formed between the color filter layer and the semiconductor substrate.

While the present invention is applied to a CCD in each of the aforementioned first to third embodiments, the present invention is not restricted to this but may alternatively be applied to another type of solid-state image pickup device such as a CMOS sensor. Also when the present invention is applied to another type of solid-state image pickup device such as a CMOS sensor, effects similar to those of the aforementioned embodiments such as improvement of photosensitivity of the solid-state image pickup device can be attained.

While the plurality of lenses consist of the single continuous layer in each of the aforementioned embodiments, the present invention is not restricted to this but the plurality of lenses may alternatively be constituted to include portions consisting of a single continuous layer and portions consisting of other layers.

What is claimed is:

1. A solid-state image pickup device comprising:
   a plurality of photodetection parts formed on a substrate;
   a color filter layer;
   a shielding member formed on a region between an adjacent pair of said photodetection parts; and
   a plurality of lenses, formed between said shielding member and said color filter layer for condensing light on said photodetection parts, wherein
   said plurality of lenses have flat surfaces,
   one of said plurality of lenses and a lens adjacent to said one of said plurality of lenses are formed by a single continuous layer so formed as to have a prescribed thickness between said one of said plurality of lenses and said adjacent lens, such that no gap is formed between said one of said plurality of lenses and said adjacent lens, and
   the lens center of said plurality of lenses are deviated from the centers of said photodetection parts by a prescribed distance.

2. The solid-state image pickup device according to claim 1, further comprising a shielding member formed on a region, located between a pair of adjacent said photodetection parts, between said substrate and said lens, wherein
   the lower end of said lens is arranged upward beyond the upper end of said shielding member.

3. The solid-state image pickup device according to claim 1, further comprising a photodetection region formed on said substrate by a plurality of said photodetection parts, wherein
   a plurality of said lenses are provided to correspond to the respective ones of said plurality of photodetection parts, and
   the deviation between the lens center of said lens located in the vicinity of an end of said photodetection region and the center of corresponding said photodetection part is larger as compared with the deviation between the lens center of said lens located in the vicinity of the central portion of said photodetection region and the center of corresponding said photodetection part.

4. The solid-state image pickup device according to claim 1, further comprising a photodetection region formed on said substrate by a plurality of said photodetection parts, wherein
   the deviation between the lens centers of said lenses and the centers of corresponding said photodetection parts is gradually increased from the vicinity of the central portion of said photodetection region toward said end of said photodetection region along the direction of arrangement of said plurality of photodetection parts.

5. The solid-state image pickup device according to claim 4, wherein
   the deviation between the lens centers of said lenses and the centers of corresponding said photodetection parts is calculated according to the following formula:

$$a \times h/L$$

assuming that L represents the distance between said photodetection parts and an exit pupil, h represents an arbitrary distance larger than the distance between the vertical position of the upper surfaces of said photodetection parts and the vertical position of the boundary between an adjacent pair of said lenses and smaller than the distance between the vertical position of the upper surfaces of said photodetection parts and the vertical position of the lens centers of said lenses and a represents the distance between the center of arbitrary said photodetection part in said photodetection region and the center of said photodetection region.

6. A solid-state image pickup device comprising:
   a plurality of photodetection parts formed on a substrate;
   a color filter layer;
   a shielding member formed on a region, located between a pair of adjacent said photodetection parts, between said substrate and said lens;
   a plurality of lenses, formed between said shielding member and said color filter layer for condensing light on said photodetection parts;
   a flattened film having a flat upper surface at least flush with the upper end of said shielding member, wherein
   said plurality of lenses have flat surfaces, one of said plurality of lenses and a lens adjacent to said one of said plurality of lenses are formed by a single layer so formed as to have a prescribed thickness between said one of said plurality of lenses and said adjacent lens, the lens center of said plurality of lenses are deviated from the centers of said photodetection parts by a prescribed distance, the lower end of said lens is arranged upward beyond the upper end of said shielding member, and said lens is formed on said upper surface of said flattened film.

7. The solid-state image pickup device according to claim 6, wherein said flattened film is formed to cover said shielding member.

8. The solid-state image pickup device according to claim 6, wherein said flattened film is formed to cover the side surfaces and the lower surface of said shielding member, and the upper end of said shielding member and said upper surface of said flattened film are substantially flush with each other.

9. The solid-state image pickup device according to claim 6, wherein said lens includes an upwardly convexed upper surface part and a lower surface part consisting of a flat surface coming into contact with said upper surface of said flattened film.

10. The solid-state image pickup device according to claim 9, further comprising a resin layer having a flat upper surface formed to cover said upwardly convexed upper surface part of said lens, wherein said color filter layer is formed on said flat upper surface of said resin layer.

* * * * *